United States Patent [19]

Duncan et al.

[11] Patent Number: 5,793,662
[45] Date of Patent: Aug. 11, 1998

[54] NULL CONVENTION ADDER

[75] Inventors: David A. Duncan, Arden Hills; Gerald E. Sobelman, Minnetouka; Karl M. Fant, Minneapolis, all of Minn.

[73] Assignee: Theseus Research, Inc., St. Paul, Minn.

[21] Appl. No.: 483,557

[22] Filed: Jun. 7, 1995

Related U.S. Application Data

[63] Continuation-in-part of Ser. No. 318,510, Oct. 5, 1994, Pat. No. 5,664,211, which is a continuation-in-part of Ser. No. 220,636, Mar. 31, 1994, Pat. No. 5,664,212, which is a continuation of Ser. No. 74,288, Jun. 8, 1993, Pat. No. 5,305,463.

[51] Int. Cl.$^6$ .................................................. G06F 7/50
[52] U.S. Cl. ........................... 364/768; 364/784; 395/800
[58] Field of Search ........................... 364/768, 784–788, 364/936.1; 395/800

[56] References Cited

U.S. PATENT DOCUMENTS

| | | | |
|---|---|---|---|
| 4,140,920 | 2/1979 | Dao et al. | 364/773 |
| 4,845,633 | 7/1989 | Furtek | 326/38 |

FOREIGN PATENT DOCUMENTS

| | | |
|---|---|---|
| 0 566 739 A1 | 10/1993 | European Pat. Off. . |
| 0 570 584 A1 | 11/1993 | European Pat. Off. . |
| 0 578 821 A1 | 1/1994 | European Pat. Off. . |
| WO 92/12498 | 7/1992 | WIPO . |
| WO 92/16971 | 10/1992 | WIPO . |
| WO 94/03929 | 2/1994 | WIPO . |

OTHER PUBLICATIONS

Daniel Hampel and Robert Winder, Threshold Logic, IEEE Spectrum, May 1971, pp. 32–39.

M.R. Greenstreet, T.E. Williams, and J. Staunstrup, Self-Timed Iteration, Elsevier Science Publishers B.V. (North-Holland), IFIP, 1988, pp. 309–322.

Teresa H.-Y. Meng, Robert W. Broderson, and David G. Messerschmitt, Automatic Synthesis of Asynchronous Circuits from High-Level Specifications, IEEE Transactions on Computer-Aided Design, vol. 8, No. 11, Nov. 1989, pp. 1185–1205.

Ted Williams, Latency and Throughput Tradeoffs in Self--Timed Speed-Independent Pipelines and Rings, Stanford University Technical Report No. CSL-TR-91-482, May 1991.

Jens Sparso and Jorgen Staunstrup, Delay-insensitive multi-ring structures, Integration, the VLSI Journal 15, 1993, Elsevier Science Publishers B.V., pp. 313–340.

Tzyh-Yung Wuu and Sarma B.K. Vrudhula, A Design of a Fast and Area Efficient Multi-Input Muller C-element, IEEE Transactions on VLSI Systems, vol. 1, No. 2, Jun. 1993, pp. 215–219.

(List continued on next page.)

*Primary Examiner*—Reba I. Elmore
*Assistant Examiner*—Emmanuel L. Moise
*Attorney, Agent, or Firm*—Steptoe & Johnson LLP

[57] ABSTRACT

A NULL convention full adder receives a plurality of inputs, each having an asserted state and a NULL state. The adder switches its output to an asserted state when all inputs have been received and summed. The adder switches its output to the NULL state only after all inputs have returned to NULL. A register can be incorporated into each full adder. Multiple full adders are combined into multi-bit adders with registration.

24 Claims, 11 Drawing Sheets

OTHER PUBLICATIONS

Marc Renaudin and Bachar El Hassan, The Design of Fast Asynchronous Adder Structures and Their Implementation Using D.C.V.S. Logic, Int'l. Symposium on Circuits & Systems, vol. 4, 1994, pp. 291–294.

Richard G. Buford, Xingcha Fan and Neil W. Bergmann, An 180 Mhz 16 bit Multiplier Using Asynchronous Logic Design Techniques, IEEE 1994 Custom Integrated Circuits Conference, pp. 215–218.

Ted Williams, Self–Timed Rings and Their Application to Division, Stanford University Technical Report No. CSL–TR–91–482, May 1991.

David E. Muller, Asynchronous Logics and Applications to Information Processing, Stanford University Press, Switching Theory In Space Technology, pp. 289–297, 1963.

Narinder Pal Singh, A Design Methodology For Self–Timed Systems, Massachusetts Institute of Technology, MIT/LCS/TR–258, Feb. 1981.

T.S. Anatharaman, A Delay Insensitive Regular Expression Recognizer, Dept. of Computer Science, Carnegie–Mellon University, CMU–CS–89–109, Jan. 1989.

Jens Sparso, et al., Design of Delay Insensitive Circuits Using Multi–Ring Structures, European Design Automation Conference, IEEE 0–8186–2780, pp. 15–20, Aug. 1992.

Lawrence G. Heller, et al., Cascode Voltage Switch Logic: A Different CMOS Logic Family, ISSCC 84 Digest of Technical Papers, IEEE, pp. 16–17, Feb. 1984.

Stephen H. Unger, Asynchronous Sequential Switching Circuits, 1969, pp. 221–229.

Carver Mead & Lynn Conway, Introduction to VLSI Systems, 1980, pp. 242–262.

Ivan E. Sutherland, Micropipelines, Communications of the ACM, Dec. 1989, vol. 32, No. 6.

Tadashi Shibata & Tadahiro Ohmi, A Functional MOS Transistor Featuring Gate–Level Weighted Sum and Threshold Operations, IEEE Transactions On Electron Devices, Dec. 1992, vol. 39, No. 6, pp. 1444–1455.

Anthony S. Wojcik & Kwang–Ya Fang, On The Design Of Three–Valued Asynchronous Modules, IEEE Transactions On Computers, Oct. 1990, vol. c–29, No. 10, pp. 889–898.

Mark Edmund Dean, Strip: A Self–Time Risc Processor, Stanford University Computer Systems Laboratory Technical Report No. CSL–TR–92–543, Stanford, CA, Jul. 1992.

Daniel Hampel & Robert Winder, Threshold Logic, IEEE Spectrum, May 1971, pp. 32–39.

Janusz A. Brzozowski & Carl–Johan H. Seger, Asynchronous Circuits –Monographs in Computer Science, Springer–Verlag New York, Inc., 1995, New York, NY.

NULL CONVENTION ADDER

This application is a continuation in part of U.S. patent application Ser. No. 08/318,510 filed Oct. 5, 1994 entitled "NULL CONVENTION THRESHOLD GATE", now U.S. Pat. No. 5,664,211, which was a continuation-in-part of U.S. patent application Ser. No. 08/220,636 filed Mar. 31, 1994 entitled "NULL CONVENTION LOGIC SYSTEM", now U.S. Pat. No. 5,664,212, which was a continuation of U.S. patent application Ser. No. 08/074,288 filed Jun. 8, 1993, now U.S. Pat. No. 5,305,463.

BACKGROUND OF THE INVENTION

Previous logic systems, such as boolean logic systems, have employed clocking signals to synchronously regulate the sequential processing of binary logic signals. Typically, a sequential logic circuit will respond to multiple inputs to generate an output. As input logic signals propagate through the sequential circuit, the sequential circuit output is unreliable for a period of time corresponding to worst case propagation delays through the individual logic gates. Typically, the output signal is sampled at a time when the output is stable, often by latching the output into a register. The sampling time is set according to an independent clock signal, i.e., one that is not derived from the states of the logic gates themselves.

While these traditional synchronous circuits have become the dominant class of logic, a substantial amount of design analysis is necessary to avoid a variety of timing-related problems, such as race conditions. In addition, the fraction of power and chip real estate that must be devoted to clocking has become substantial, and in certain instances has become a limiting factor to the total amount of circuitry that can be integrated onto a single chip.

SUMMARY OF THE INVENTION

An object of this invention is to provide a NULL convention full adder for use in asynchronous circuits.

A further object of this invention is to provide a NULL convention full adder using a minimal number of NULL convention threshold gates.

A further object of this invention is to provide a NULL convention full adder using feedback to hold the adder output asserted until all inputs have returned to NULL.

A further object of this invention is to provide a NULL convention full adder using static CMOS transistors.

A further object of this invention is to provide a NULL convention full adder using dynamic CMOS transistors.

A further object of this invention is to provide a NULL convention full adder especially adapted for receiving mutually exclusive assertion groups.

A further object of this invention is to provide a NULL convention full adder especially adapted for transmitting mutually exclusive assertion groups.

A further object of this invention is to provide a NULL convention full adder with embedded asynchronous registration of output.

A further object of this invention is to provide a NULL convention combinational circuit configured as a multibit adder.

A further object of this invention is to provide a NULL convention combinational circuit configured as a multibit adder with embedded registration.

A further object of this invention is to provide a NULL convention combinational circuit configured as a multibit adder with end of ripple detection.

These and other objects are achieved by providing a full adder having NULL convention threshold gates. The full adder receives input from alternating NULL and DATA wavefronts. The adder does not assert meaningful sum output until all inputs have been received and propagated from the DATA wavefront. Furthermore, the adder outputs are maintained and are not returned to NULL until all inputs have been received and propagated from the NULL wavefront.

The preferred embodiment of the NULL convention full adder uses four NULL convention threshold gates to receive and add input data and to present output data. The inputs and outputs are configured in mutually exclusive assertion groups. When inputs are received on each input group, the values are summed and the output groups are asserted. The output lines are held at their asserted values until each input line returns to NULL.

Asynchronous registration may be embedded in the output stage of the NULL convention full adder. This is achieved simply by adding a NULL convention control line and increasing the threshold level of the sum output threshold gate by one. When inputs are received on each input group, the values are summed, but the output groups are not asserted until the control line is asserted. The output lines are held at their asserted values until each input line returns to NULL and the control line returns to NULL.

NULL convention full adders may be combined to form multibit adders of many types, such as ripple carry, carry lookahead, carry select, and carry save. Asynchronous registration and completion detection may be added at the output stages to control input and output flow through the multibit adders.

BRIEF DESCRIPTION OF THE DRAWINGS

The invention will be described below with reference to attached drawings in which.

DETAILED DESCRIPTION OF THE PREFERRED EMBODIMENTS

A NULL convention combinational circuit generates a result value set in response to an input value set. An important aspect of NULL convention circuits is that any particular input may have a meaningful value or a NULL value which has no meaning. The very presence of a non-NULL value indicates that the value has meaning, and no external clock is required to indicate that a value is meaningful. Further information regarding NULL convention logic can be found in U.S. Pat. No. 5,305,463, which is incorporated here by reference. Certain aspects are reiterated here for convenience.

NULL convention differs from traditional boolean logic where each signal line may have one of two meaningful states. In traditional logic that uses CMOS or TTL implementation, a low voltage level on a signal line means "logic false" or the number "zero." A high voltage level on the same line means "logic true" or the number "one." Thus a signal line may assume one of two values, either of which may or may not be meaningful.

NULL convention has multiple implementations which include a NULL state which has no meaning. In one implementation, two separate signal lines would be used in order to convey two meaningful values. For example, logic "false" would be conveyed by asserting a high voltage on the first line and a low voltage on the second line. Logic "true" would be conveyed by asserting a low voltage on the first line and a high voltage on the second line. NULL would be conveyed by low voltage levels on both lines. (High voltage levels on both lines is unused.) In this example, meaning is expressed according to the signal line asserted, not by the choice of voltage level. A high voltage level "asserts" the meaning of the line. A low voltage level is meaningless.

In another implementation, multiple voltages can be used on a single line to convey multiple meanings and NULL. For example, each signal line may be allowed to assume three voltage levels. A positive voltage level asserts the meaning "true", a negative voltage level asserts the meaning "false", and the zero voltage level is NULL (meaningless). In other implementations, parameters other than voltage may be used as long as the requisite number of states can be differentiated. Discussions here will assume an implementation in which each signal line may assume two voltage levels, with a high level asserting meaning and the ground voltage level being NULL. This provides voltage levels as concrete examples to aid in explanation, but the invention is not limited to these voltage-level examples.

Figure 1:
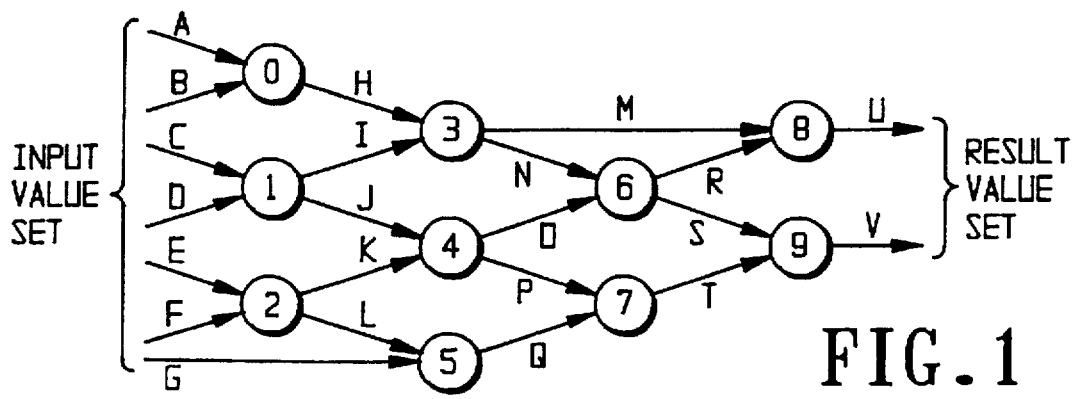
FIG. 1 illustrates a NULL convention combinational circuit.

Another important aspect of NULL convention circuits is the way that meaningful and NULL signals propagate through a combinational circuit. All inputs to a NULL convention logic element must be meaningful before the element asserts a meaningful output. FIG. 1 illustrates a NULL convention combinational circuit. In FIG. 1, logic gates are shown as circles and labeled with numerals 0–9. Input lines are labeled with letters A–G, output lines are labeled with letters U,V, and internal connection lines are labeled with letters H–T. Signal lines are schematic, and may be individual conductors, multiple conductors, or another NULL convention configuration.

In a NULL convention circuit, a logic gate transitions from a NULL to a meaningful output value after all inputs have assumed meaningful values. For example, as illustrated in FIG. 1, assume that input lines A and B initially have NULL values, and logic gate zero (0) initially has a NULL output. In the case that only input line A transitions to a meaningful value (while input line B remains at NULL), logic gate zero will maintain a NULL output value. In the case that only input line B transitions to a meaningful value (while input line A remains at NULL), logic gate zero still will maintain a NULL output. When both input lines A and B transition to meaningful values (either simultaneously or sequentially), then logic gate zero (0) will change its output to a meaningful value.

The characteristic described above applies to all logic gates in the sequential circuit. Logic gates zero through two, which are directly connected to input lines, will provide meaningful values to the next level or layer of gates (three through five) only when the respective inputs have completely assumed meaningful values. This produces a general result that can be visualized as a wavefront of meaningful values propagating through the network. At the network output, logic gates eight and nine will change their individual outputs from NULL to meaningful values only when all upstream gates have propagated meaningful values.

Two important characteristics should now be apparent. First, the network outputs transition from NULL to meaningful values cleanly. That is, the outputs do not switch back and forth (i.e., chatter) while partial results have propagated through the intermediate gates. Second, the very presence of a meaningful value at the network output is sufficient to indicate that the network has conclusively resolved all intermediate logic operations. The very presence of a meaningful value is sufficient to indicate that the value is steady, valid, complete, and may be used by downstream circuitry. Thus, no external clock is required to indicate that the network has completed its operations.

The NULL convention logic gates discussed here also exhibit a second characteristic; their outputs transition from a meaningful value to NULL only when all inputs have switched to NULL. In this way, NULL values propagate through the network cleanly, and the very presence of NULL values at the output is sufficient to indicate that all gates in the network have returned to NULL output states.

Figure 2:
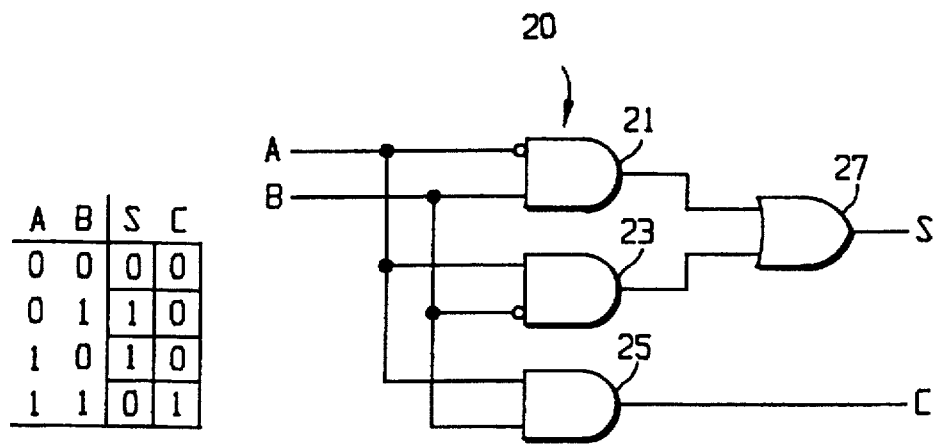
FIG. 2 illustrates a Boolean half-adder.

FIG. 2 illustrates a Boolean half-adder 20 constructed of three conventional AND gates 21, 23, 25 and an OR gate 27. The half adder has two input signal lines A and B, and two output line S (sum) and C (carry). Each input line may assume one of two meaningful values: "zero" and "one." Each output line may assume one of two meaningful values: "zero" and "one." The half adder implements a transfer function such that:

1) when both inputs are zero, sum (S) and carry (C) outputs are "zero;"
2) when a single input is "one" (and the other is "zero"), sum is "one" and carry is "zero;"
3) when both inputs are "one," sum is "zero" and carry is "one."

Figure 3:
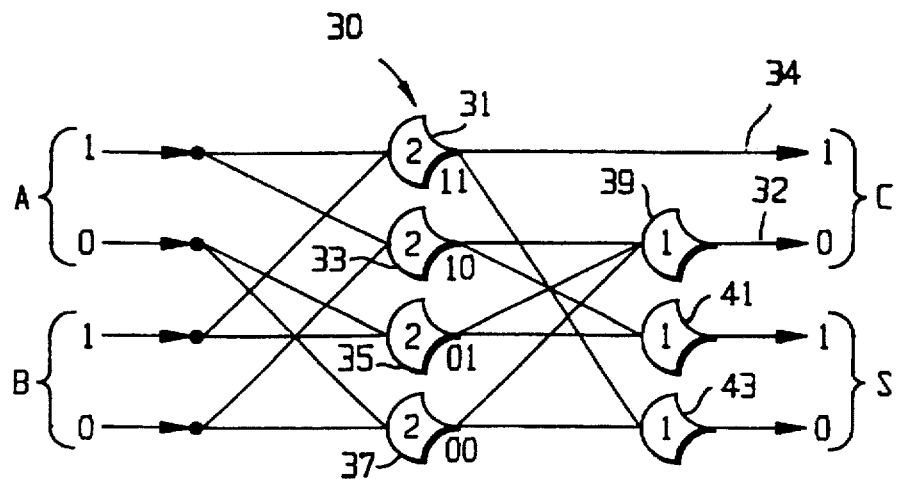
FIG. 3 illustrates a "two-wire" NULL convention half adder.

For comparison, FIG. 3 illustrates a "two-wire" NULL convention half adder 30. It is similar to the Boolean half-adder of FIG. 2 in that there are two inputs A and B and two outputs S and C, and it implements the same transfer function as that of FIG. 2. Unlike the Boolean circuit, the NULL convention half-adder has a separate signal line for each meaning. The carry output, for example, has two separate signal lines 32, 34, each of which may assume one of two voltage levels. A first voltage level is meaningful and the other voltage level is NULL. In order to assert a meaning of "carry equals zero," the first signal line 32 (designated as having a meaning "zero" when asserted) is driven to its meaningful voltage level, while the second signal line 34 is held at the NULL voltage level. In order to assert a value "carry equals one," the first signal line 32 is held at the NULL voltage level, while the second signal line 34 (designated by design as having a meaning "one") is driven to the meaningful voltage level. The half-adder can also assert "carry has no meaning" by holding both carry signal lines at NULL. It is not permitted (i.e., illegal to have both carry lines (32, 34) at the meaningful voltage level. Similarly, the remaining inputs and outputs (A, B, S) each have a pair of signal lines. Each pair of lines is a "mutually exclusive assertion group," which means only one line of any group will be asserted at a time.

Hereafter, when a NULL convention circuit switches a signal line to a meaningful value, it will be said that the circuit "asserts" the line, or that the line is "asserted." When a NULL convention circuit switches a signal line to a NULL value, the line will be said to be NULL.

The two carry lines (32, 34) form a group in which at most one line may be asserted (i.e., assume a meaningful value). Such a group is referred to as a "mutually exclusive assertion group." In other design situations, mutually exclusive assertion groups may have more than two lines. A single line, by itself, can be considered a mutually exclusive assertion group.

Internally, the NULL convention half adder 30 of FIG. 3 is made of seven threshold gates 31, 33, 35, 37, 39, 41, 43. Each threshold gate has a single signal line output which may be asserted (assume a meaningful voltage level) or NULL (assume a NULL voltage level). The signal line may fan out to several destinations. Four of the gates 31, 33, 35, 37 have two input signal lines and a threshold of two ("two-of-two gate"). The output of a two-of-two gate is asserted when two (both) of the input lines are asserted. One of the gates 39 has three input signal lines and threshold of one ("one-of-three gate"). The output of the one-of-three gate is asserted when any one of the three inputs is asserted. Two of the gates 41, 43 have two inputs and a threshold of one. As a drawing convention, a numeral inside a threshold gate symbol indicates the number of asserted input lines needed to cause the gate to assert its output.

Each of the NULL convention gates of the half adder 30 exhibits the characteristic that it switches to a meaningful value only when the requisite number of inputs becomes meaningful, and each threshold gate holds a meaningful output value until such time that all of the inputs become NULL. Thus, threshold gates exhibit a hysteresis: as the number of inputs drops below the threshold, the output remains meaningful until the last input drops below threshold, at which time the output becomes NULL. For example, the two-of-two gates 31, 33, 35, 37 will maintain meaningful output levels when the number of meaningful inputs drops from two to one. The two-of-two gates will switch to NULL when all inputs become NULL.

It should be appreciated that a threshold gate forms a central building block of NULL convention logic circuits. The NULL convention threshold gates may be characterized by the number of inputs and the threshold value. NULL convention threshold gates have the unique operational requirement that some or all inputs will form mutually exclusive assertion groups. They further ensure completeness of the input set, in that they switch to a NULL output only when all inputs are NULL. Further information regarding NULL convention threshold gates can be found in U.S. patent application Ser. No. 08/318,510 filed Oct. 10, 1994 entitled "NULL CONVENTION THRESHOLD GATE," which is incorporated here by reference.

Figure 4:
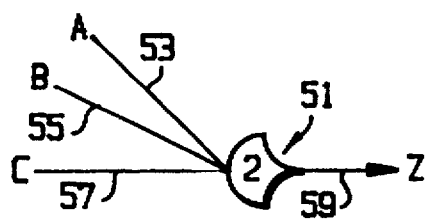
FIG. 4 illustrates a symbol for a three-input, threshold-two (two-of-three) NULL convention logic gate.

FIG. 4 symbolically illustrates a three-input, threshold-two (two-of-three) NULL convention logic gate having inputs A, B, and C and output Z. Here, each input line 53, 55, 57 and the output line 59 each represent one signal line which is capable of assuming a meaningful value or NULL.

When a majority of the input signals A, B, and C are asserted, the output Z is asserted. After the output has been asserted, the output returns to NULL only when all the inputs A, B, and C return to NULL.

Another way of understanding the operation of the gate of FIG. 4 is with an algebraic expression for the switching behavior. The function gate output should be asserted if any of the following conditions are true:

1) A and B are asserted;
2) A and C are asserted;
3) A and Z are asserted;
4) B and C are asserted;
5) B and Z are asserted;
6) C and Z are asserted.

This can be expressed in traditional Boolean terms as:

$$f=(A*B)+(A*C)+(A*Z)+(B*C)+(B*Z)+(C*Z)$$

where "+" is the OR operator, and
where "*" is the AND operator.
The equation above can be re-written as:

$$f=(A+B)*(C+Z)+(A*B)+(C*Z).$$

Similarly, the majority function gate output should be NULL when it is not asserted. Stated algebraically:

$$\begin{aligned}\bar{f} &= \overline{(A+B)*(C+Z)+(A*B)+(C*Z)} \\ &= \bar{A}*\bar{B}*(\bar{C}+\bar{Z})+\bar{C}*\bar{Z}*(\bar{A}+\bar{B})\end{aligned}$$

Figure 5:
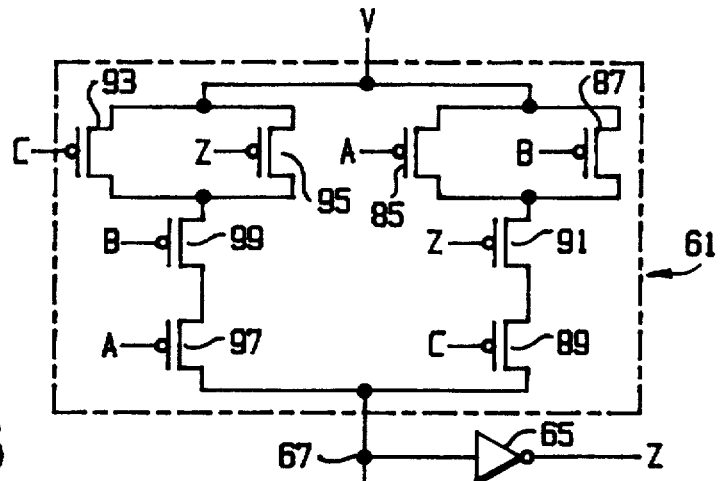
FIG. 5 illustrates a transistor-level circuit diagram of a static CMOS implementation for the NULL convention threshold gate of FIG. 4.
Figure 5:
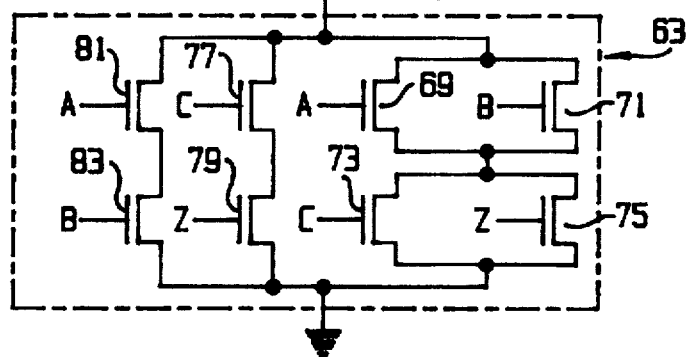

FIG. 5 illustrates a transistor-level circuit diagram of a static CMOS implementation for the gate 51 of FIG. 4. The circuit includes a pull-up sub-circuit 61, a pull-down sub-circuit 63 and an inverting driver 65 connected at a common signal node or junction 67. The pull-down sub-circuit 63 implements the function for generating an asserted output, expressed above as:

$$f=(A+B)*(C+Z)+(A*B)+(C*Z);$$

where the OR function is implemented with parallel-connected transistors, and the AND function is implemented with serially-connected transistors. When a condition of the function is met, the pull-down circuit 63 will connect the inverting driver 65 input to ground, which results in an asserted output.

In FIG. 5, the (A+B) term is implemented with parallel NMOS transistors 69, 71 having gates connected to input signal lines A and B, and having commonly connected sources and drains. The (C+Z) term is implemented with parallel NMOS transistors 73, 75; transistor 73 having its gate connected to input signal line C, and transistor 75 having its gate connected to feedback signal line Z. The NMOS transistors 73, 75 have commonly connected sources and drains. The combined term (A+B)*(C+Z) is implemented by serially connecting the parallel transistor pairs for (A+B) and (C+Z) between the signal junction 67 and ground.

The term (C*Z) is implemented with serially connected NMOS transistors 77, 79, with one having a gate connected to the C input signal line and the other having a gate connected to the Z feedback signal line. The NMOS transistors 77, 79 have sources and drains connected in series between the signal junction 102 and ground. The term (A*B) is implemented by serially connecting sources and drains of NMOS transistors 81, 83 between the signal junction 67 and ground, and by connecting the A input signal line to one gate, and the B input signal line to the other gate.

The overall function for the asserted output is implemented by parallel connection of the implementations of the three terms: (A+B)*(C+Z), (A*B), and (C*Z).

The pull-up sub-circuit 61 is a similar implementation of the terms $\overline{A}*\overline{B}*(\overline{C}+\overline{Z})$ and $\overline{C}*\overline{Z}*(\overline{A}+\overline{B})$ discussed above. The term $(\overline{A}+\overline{B})$ is implemented through the parallel connection of two PMOS transistors 85, 87 with gates connected to the A and B inputs. The term $\overline{C}*\overline{Z}*(\overline{A}+\overline{B})$ is implemented by the series connection of the implementation for $(\overline{A}+\overline{B})$ with two additional PMOS transistors 89, 91 for the $\overline{C}$ and $\overline{Z}$ inputs.

In a similar fashion, the term $\overline{A}*\overline{B}*(\overline{C}+\overline{Z})$ is implemented by connecting two PMOS transistors 93, 95 in parallel (for $\overline{C}$ and $\overline{Z}$ inputs), and connecting this parallel arrangement in series with two additional serially connected PMOS transistors 97, 99 for the A and B inputs. The overall pull-up function is implemented by connecting implementations for individual terms in parallel between the voltage source V and the signal junction 67. Thus, when any of the NULL conditions are met, the signal junction 67 is connected to voltage source V, causing the inverter 65 to output NULL on output line Z.

Figure 6:
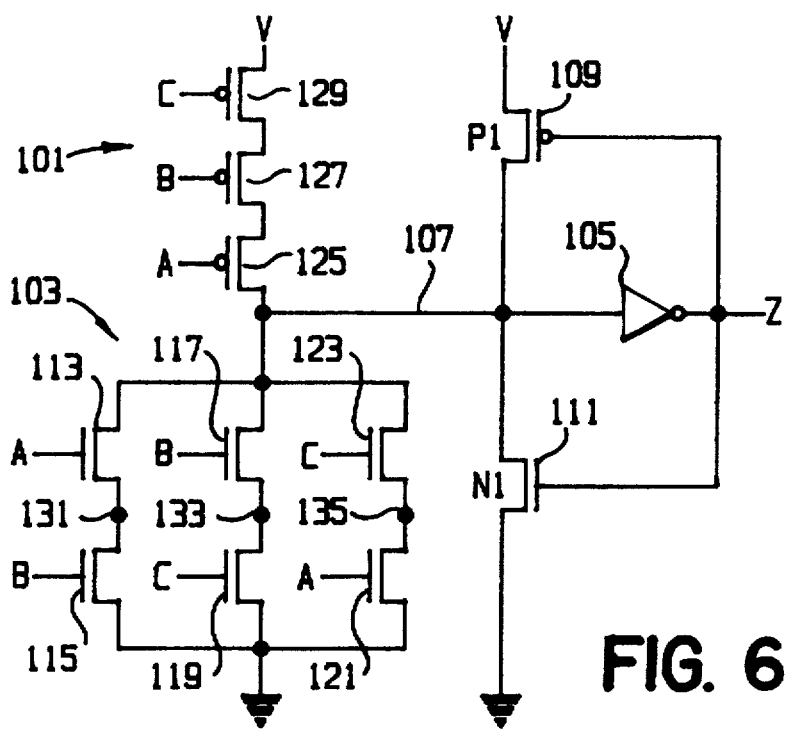
FIG. 6 illustrates a transistor-level circuit diagram of a semi-static CMOS implementation for the gate of FIG. 4.

FIG. 6 illustrates a transistor-level circuit diagram of a semi-static CMOS implementation for the gate 51 of FIG. 4. The circuit includes a pull-up sub-circuit 101, a pull-down sub-circuit 103, a PMOS "keeper" transistor 109, a NMOS "keeper" transistor 111 and an inverting output driver 105 all connected at a common signal junction 107.

The pull-down sub-circuit 103 implements the logic for asserting the output Z. As seen above, the output should be asserted if either:

1) A and B are asserted; or
2) B and C are asserted; or
3) A and C are asserted; or
4) any one of A, B, or C is asserted and the output Z was asserted.

The first condition is implemented by first and second NMOS transistors 113, 115, the first transistor 113 having a gate connected to signal A, the second transistor 115 having a gate connected to signal B, both connected in series between the common signal junction 107 and ground. The second condition is implemented by third and fourth NMOS transistors 117, 119 connected in series between the common signal junction 107 and ground. The third condition is implemented by fifth and sixth NMOS transistors 121, 123 connected in series between the common signal junction 107 and ground.

The fourth condition is implemented by the "keeper" NMOS transistor 111. The output of the inverting output driver 105 connects to the gates of the "keeper" PMOS transistor 109 and of the "keeper" NMOS transistor 111. The output Z is not used as a separate logic input, but to control these weak devices which prevents the circuit from switching when the common signal junction 107 otherwise would be isolated.

The pull-up sub-circuit 101 includes first, second and third PMOS transistors 125, 127, 129 connected in series, each connected to one of the inputs A, B and C. When all three inputs are NULL, the three PMOS transistors 125, 127, 129 switch on, pulling the common signal junction 107 high and causing the inverting output driver 105 to generate a NULL output. When one or two of the inputs is NULL, either the "keeper" PMOS transistor 109 or the "keeper" NMOS transistor 111 prevents the common signal junction 107 from being isolated and holds the circuit in its previous state. This feature is discussed more fully below.

Operation of the circuit will be described by following a series of input transitions. Initially, inputs A, B and C are NULL. Each of the NMOS transistors in the pull-down circuit 103 are off. Each of the PMOS transistors in the pull-up circuit 101 are on, which pulls the common signal junction 107 to the voltage reference V. The input to the inverting output driver 105 is "high," and the output Z is NULL. The "keeper" NMOS transistor 111 is off (because its gate is "low"), and the "keeper" PMOS transistor 109 is on. All four PMOS transistors 109, 125, 127, 129 pull the signal junction 107 high, and the circuit is in a stable state and exhibiting a NULL on output Z.

When one of the three inputs, A, B, or C, becomes asserted, while the others remain NULL, the circuit output Z does not change state. If input A, for example, is asserted, the PMOS transistor 125 switches off, and the NMOS transistors 113, 121 switch on. With one PMOS transistor of the pull-up circuit 101 OFF, and at least one NMOS transistor in each parallel set of the pull-down circuit 103 OFF, the common signal junction 107 is isolated except for the weak "keeper" PMOS transistor 109 which holds the common signal junction HIGH. The same result occurs when input B or C is asserted while the other inputs remain NULL; accordingly, the output Z remains NULL.

When two inputs become asserted, two of the PMOS transistors in the pull-up circuit 101 are off and two NMOS transistors of one parallel branch of the pull-down circuit 103 are on. For example, if inputs A and B are asserted, NMOS transistors 113 and 115 switch on, pulling the common signal junction 107 to ground. This causes the inverting output driver 105 to assert the output Z. The first PMOS transistor 109 will switch off, and the first NMOS transistor 111 will switch on. All three NMOS transistors 111, 113, 115 pull the signal junction 107 to ground, and the circuit is in a stable state. For a brief period, both the "keeper" PMOS transistor 109 will be on (because the output was initially NULL) and the NMOS transistors 113, 115 will also be on (because the inputs have been asserted). The stronger NMOS transistors will dominate the weaker PMOS transistor, and the common signal junction will be pulled to ground.

When one input returns to NULL, the circuit output does not change. One of the PMOS transistors of pull-up circuit 101 will switch on, and one of the NMOS transistors of pull-down circuit 103 will switch off, causing the one of the parallel branches to disconnect the common signal junction 107 from ground. The (weak) "keeper" NMOS transistor 111 is still on (because the output is asserted), and the common signal junction 107 remains at ground.

When all inputs return to NULL, the circuit returns to its initial state with all PMOS transistors of the pull-up circuit 101 on and all NMOS transistors of the pull-down circuit 103 off. For a brief period of time, the weak "keeper" NMOS transistor 111 will be on and in competition with the strong PMOS transistors 125, 127, 129, but the strong PMOS transistors 125, 127, 129 will pull the common signal junction 107 to the voltage source. Thus, the term "weak" means that the set of pull-up transistors 101 and one parallel branch of pull-down transistors can pull the common signal junction 107 across the switching threshold of the inverting output driver 105, even against the opposing action of one of the weak "keeper" transistors 109, 111. For example, W/L (width/length) for the "keeper" PMOS transistor 109 can be much smaller than W/L for the pull-up PMOS transistors 125, 127, 129. The "keeper" NMOS transistor 111 is similarly weak compared to one parallel branch of pull-down NMOS transistors 103.

In this semi-static gate implementation, the feedback signal Z is not returned as an input as other signal inputs. Instead, the feedback signal Z turns on and off the "keeper" devices formed by the weak transistors. Without the weak transistors, the common signal junction 107 would be isolated when one input is asserted and the other inputs are NULL. Note that the first, third and fifth NMOS transistors 113, 117, 123 connect directly to the common signal junction 107. The A input connects to one and only one of these three transistors (i.e., NMOS transistor 113), the B input connects to one and only one (i.e., NMOS transistor 117), and the C input connects to one and only one (i.e., NMOS transistor 123). This arrangement minimizes the charge sharing between junctions 131, 133, 135 and the common signal junction 107.

Figure 7:
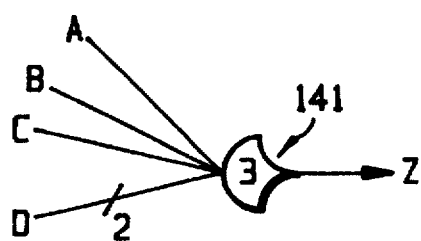
FIG. 7 illustrates a symbol for a four-input, threshold-three (three-of-four) NULL convention logic gate with one input having a weight of two.

FIG. 7 symbolically illustrates a four-input, threshold-three (three-of-four) NULL convention threshold gate 141 having an output Z. One input D has a weight twice that of the other three inputs A, B, and C. The operation of the gate of FIG. 7 can be explained logically as follows. The output Z of the gate is asserted when any of the following conditions are true:

1) A, B, and C are asserted; or
2) D is asserted and any one of the inputs A, B, or C is asserted; or
3) Z is asserted and any of the four inputs is asserted.

This can be expressed in traditional Boolean terms as:

$$f=(A*B*C)+D*(A+B+C)+Z*(A+B+C+D)$$

The equation above can be re-written as:

$$f=(A*B*C)+(D+Z)*(A+B+C)+(D*Z).$$

Similarly, the output of the gate 141 of FIG. 7 should be NULL when it is not asserted. Stated algebraically:

$$\bar{f} = \overline{(A*B*C)+D*(A+B+C)+Z*(A+B+C+D)}$$
$$= (\bar{A}+\bar{B}+\bar{C})*\bar{D}*\bar{Z}+\bar{A}*\bar{B}*\bar{C}*(\bar{D}+\bar{Z})$$

Figure 8:
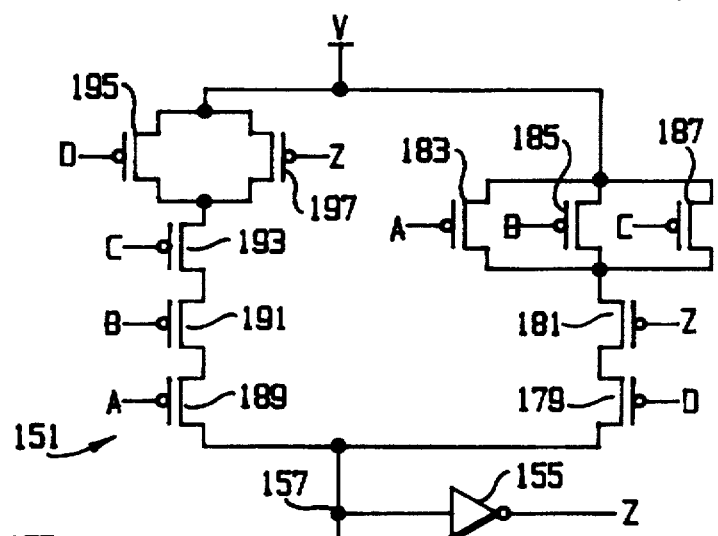
FIG. 8 illustrates a transistor-level circuit diagram of a static CMOS implementation for the gate of FIG. 7.
Figure 8:
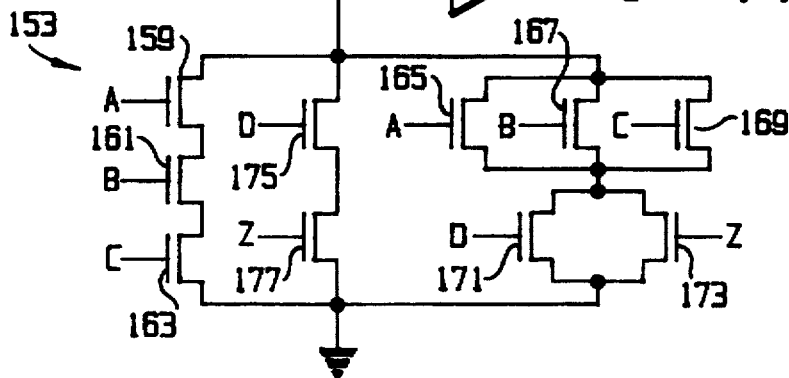

FIG. 8 illustrates a transistor-level circuit diagram of a static CMOS implementation for the gate 141 of FIG. 7. The circuit includes a pull-up sub-circuit 151, a pull-down sub-circuit 153, and an inverting driver 155 all connected to a common circuit junction 157.

The pull-down sub-circuit 153 implements the logic expression:

$$f=(A*B*C)+(D+Z)*(A+B+C)+(D*Z).$$

The term (A*B*C) is implemented in the series connection of three NMOS transistors 159, 161, 163 with their gates connected to the inputs A, B, and C, respectively.

The term (D+Z)*(A+B+C) is implemented in the series connection of the parallel network of three NMOS transistors 165, 167, 169 with the parallel network of two NMOS transistors 171, 173. The NMOS transistors 165, 167, 169 have their gates connected to the inputs A, B and C, respectively, and the NMOS transistors 171, 173 have their gates connected to the input D and the feedback signal Z, respectively.

The term (D*Z) is implemented with the series connection of two NMOS transistors 175, 177 having their gates connected to the input D and the feedback signal Z, respectively. The networks implementing the three terms are connected in parallel between the signal junction 157 and ground. When any of the terms in the expression is satisfied, the signal junction is driven to ground, causing the output Z of the inverting driver 155 to be asserted.

The pull-up sub-circuit 151 implements the logic expression:

$$\bar{f}=(\bar{A}+\bar{B}+ee+\bar{C})*\text{fheight}\bar{D}*\bar{Z}+\bar{A}*+e,ovs\ B*\bar{C}*(\bar{D}+\bar{Z})$$

The term $(\bar{A}+\bar{B}+\bar{C})*\bar{D}*\bar{Z}$ is implemented in the series connection of two serially-connected PMOS transistors 179, 181 together with a parallel network of PMOS transistors 183, 185, 187. The PMOS transistors 179, 181 have their gates connected to the inputs D and the feedback signal Z, respectively and the PMOS transistors 183, 185, 187 have their gates connected to the inputs A, B and C, respectively.

The term $\bar{A}*\bar{B}*\bar{C}*(\bar{D}+\bar{Z})$ is implemented in the series connection of three serially-connected PMOS transistors 189, 191, 193 together with the parallel network of two PMOS transistors 195, 197. The PMOS transistors 189, 191, 193 have their gates connected to the inputs A, B and C, respectively, and the PMOS transistors 195, 197 have their gates connected to the input D and the feedback signal Z, respectively. The networks implementing the two terms are connected in parallel between the voltage source V and the common signal junction 157. When either of the terms in the expression is satisfied, the signal junction 157 is connected to the voltage source V, causing the output Z of the inverting driver 155 to be NULL.

Figure 9:
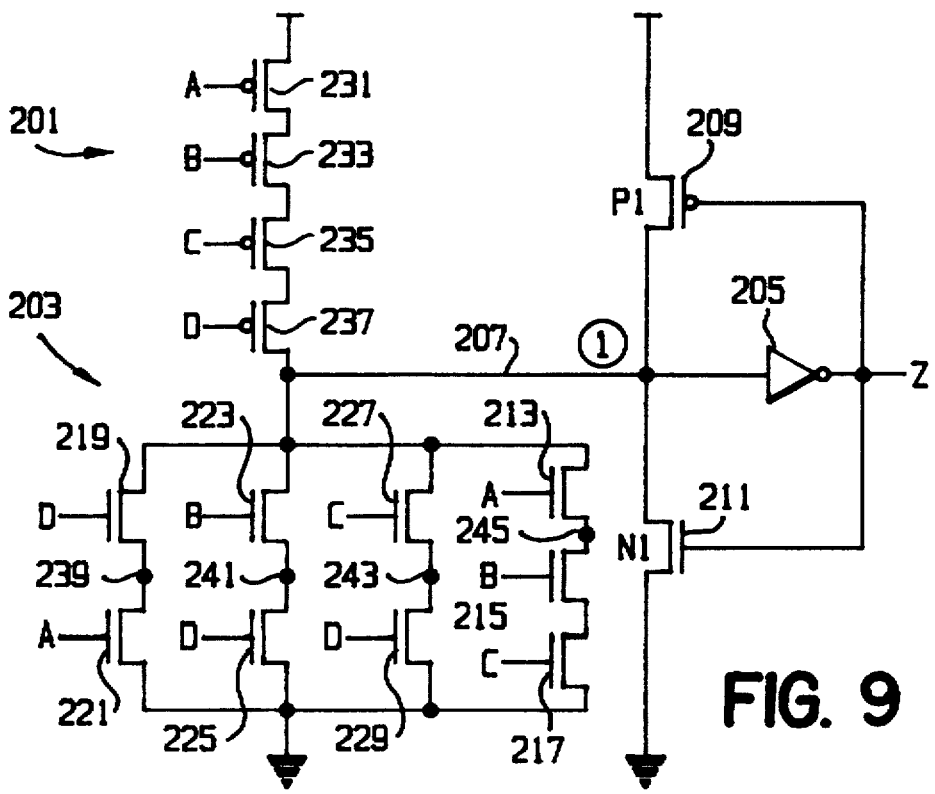
FIG. 9 illustrates a transistor-level circuit diagram of a semi-static CMOS implementation for the gate of FIG. 7.

FIG. 9 illustrates a second transistor-level circuit diagram of a semi-static CMOS implementation for the gate 141 of FIG. 7. The circuit includes a pull-up sub-circuit 201, a pull-down sub-circuit 203, a PMOS "keeper" transistor 209, a NMOS "keeper" transistor 211, and an inverting output driver 205 all connected at a common signal junction 207. The "keeper" transistors 209, 211 are weak transistors and serve to prevent the circuit from switching when the common signal junction 207 would otherwise be isolated.

The pull-down sub-circuit 203 implements the logic for asserting the output Z. As seen above, the output should be asserted if either:

1) A, B, and C are asserted; or
2) D is asserted and any of the inputs A, B, or C is asserted; or
3) Z is asserted and any of the four inputs is asserted.

The first condition is implemented by first, second and third NMOS transistors 213, 215, 217, the first transistor 213 having a gate connected to signal A, the second transistor 215 having a gate connected to signal B, and the third transistor 217 having a gate connected to signal C, all connected in series between the common signal junction 207 and ground. The second condition is implemented by a parallel network of three sets of two serially-connected NMOS transistors connected in series between the common signal junction 207 and ground. In this network, fourth and fifth NMOS transistors 219, 221 have their gates connected to inputs D and A, sixth and seventh NMOS transistors 223, 225 have their gates connected to inputs B and D, and eighth and ninth NMOS transistors 227, 229 have their gates connected to inputs C and D.

The third condition is implemented by a "keeper" NMOS transistor 211. The output of the inverting output driver 205 connects to the gates of the "keeper" PMOS transistor 209 and of the "keeper" NMOS transistor 211. The output Z is not used as a separate logic input, but to control these weak devices which prevent the circuit from switching when the common signal junction 207 otherwise would be isolated.

The pull-up sub-circuit 201 includes first, second, third and fourth PMOS transistors 231, 233, 235, 237 connected in series, each connected to one of the inputs A, B, C and D, respectively. When all four inputs are NULL, the four PMOS transistors 231, 233, 235, 237 switch on, pulling the common signal junction 207 high and causing the inverting output driver 205 to generate a NULL output. When any of the inputs is not NULL, either the "keeper" PMOS transistor 209 or the "keeper" NMOS transistor 211 prevents the common signal junction 207 from being isolated and holds the circuit in the previous state.

Note that the first, fourth, sixth and eighth NMOS transistors 213, 219, 223, 227 connect directly to the common signal junction 207. The A input connects to one and only one of these three transistors (transistor 213), the B input connects to one and only one (transistor 223), the C input connects to one and only one (transistor 227), and the D input connects to one and only one (transistor 219). This arrangement minimizes the charge sharing between junctions 239, 241, 243, 245 and the common signal junction 207.

Figure 10:
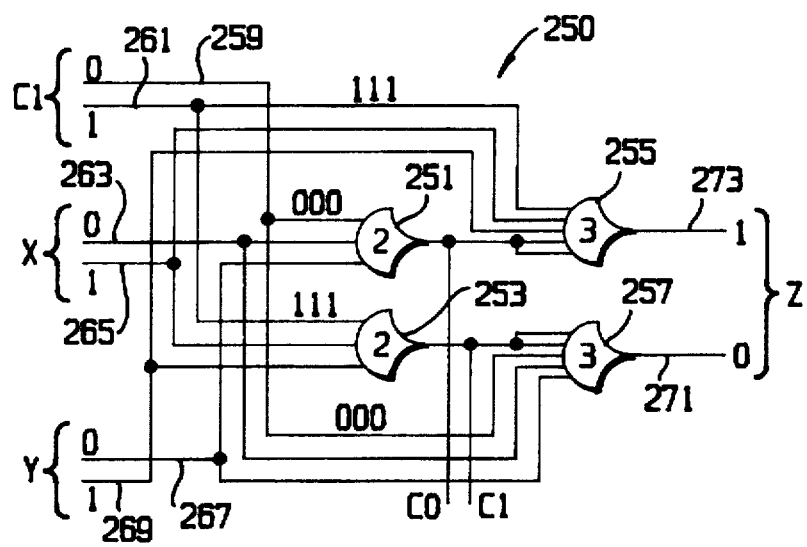
FIG. 10 illustrates a four-gate implementation of a NULL convention full adder circuit.

FIG. 10 illustrates a NULL convention full adder circuit 250 implemented through the minimal combination of four NULL convention threshold gates. This circuit includes two three-input, threshold-two (two-of-three) gates 251, 253 and two four-input, threshold-three (three-of-four) gates 255, 257 (with one input having a weight of two).

Each of the inputs CI, X and Y, as well as both of the outputs C and Z are implemented in the NULL convention full adder circuit as mutually exclusive assertion groups of two signals representing "0" and "1". Input CI consists of signal lines 259, 261, input X consists of signal lines 263, 265, input Y consists of signal lines 267, 269, output Z consists of signal lines 271, 273, and output C consists of signal lines 275, 277. The inputs are received from an external source (not shown), and the outputs are transmitted to an external destination (not shown). Only one of the two signals in each signal line pair may be asserted at one time, such that the inputs and outputs may have a "meaningful" value of only "0" or "1". Furthermore, a "non-meaningful" input or output is represented by both signals having a NULL value. For example, a "non-meaningful" X input is represented by NULL values on signal lines 263 and 265; an input of X=0 is represented by "asserting" the line corresponding to X=0 (signal line 263) while holding the line corresponding to X=1 (signal line 265) at a NULL value; and an input of X=1 is represented by "asserting" the line corresponding to X=1 (signal line 265) while holding the line corresponding to X=0 (signal line 263) at a NULL value.

The circuit of FIG. 10 implements the transfer function of TABLE 1 below.

TABLE 1

| CI =0 | =1 | X =0 | =1 | Y =0 | =1 | C =0 | =1 | Z =0 | =1 |
|---|---|---|---|---|---|---|---|---|---|
| 0 | 0 | 0 | 0 | 0 | 0 | 0 | 0 | 0 | 0 |
| 1 | 0 | 1 | 0 | 1 | 0 | 1 | 0 | 1 | 0 |
| 1 | 0 | 1 | 0 | 0 | 1 | 1 | 0 | 0 | 1 |
| 1 | 0 | 0 | 1 | 1 | 0 | 1 | 0 | 0 | 1 |
| 1 | 0 | 0 | 1 | 0 | 1 | 0 | 1 | 1 | 0 |
| 0 | 1 | 1 | 0 | 1 | 0 | 1 | 0 | 0 | 1 |
| 0 | 1 | 1 | 0 | 0 | 1 | 0 | 1 | 1 | 0 |
| 0 | 1 | 0 | 1 | 1 | 0 | 0 | 1 | 1 | 0 |
| 0 | 1 | 0 | 1 | 0 | 1 | 0 | 1 | 0 | 1 |

(0 indicates NULL, 1 indicates asserted)

In the circuit 250 of FIG. 10, the NULL convention two-of-three gate 251 has three inputs. One is connected to the input siganl line corresponding to CI=0 (signal line 259), one is connected to the input signal line corresponding to X=0 (signal line 263) and one is connected to the input signal line corresponding to Y=0 (signal line 267). The output of gate 251 is connected to the output signal line corresponding to C=0 signal line 275) and also is fed into the input of NULL convention threshold gate 255.

The NULL convention two-of-three gate 253 has three inputs. One is connected to the input signal line corresponding to CI=1 signal line 261), one is connected to the input signal line corresponding to X=1 (signal line 265) and one is connected to the input signal line corresponding to Y=1 (signal line 269). The output of gate 253 is connected to the output signal line corresponding to C=1 (signal line 277) and also is fed into the input of NULL convention threshold gate 257.

The NULL convention three-of-four gate 255 has four inputs. One is connected to the input signal line corresponding to CI=1 (signal line 261), one is connected to the input signal line corresponding to X=1 (signal line 265), one is connected to the input signal line corresponding to Y=1 (signal line 269) and one is connected to the output of NULL convention threshold gate 251. The input from the gate 251 output is weighted at twice the value of the other three inputs. The output of gate 255 is connected to the output signal line corresponding to Z=1 (signal line 273).

The NULL convention three-of-four gate 257 has four inputs. One is connected to the input signal line corresponding to CI=0 (signal line 259), one is connected to the input signal line corresponding to X=0 (signal line 263), one is connected to the input signal line corresponding to Y=0 (signal line 267) and one is connected to the output of NULL convention threshold gate 253. The input from gate 253 is weighted at twice the value of the other three inputs. The output of gate 257 is connected to the output signal line corresponding to Z=0 (signal line 271).

An important feature of the NULL convention full adder circuit 250 of FIG. 10 is that meaningful outputs are held until all inputs return to NULL. Thus, the presence of "meaningful" inputs and outputs is readily detected without the need of synchronizing hardware. The inputs to the full adder circuit 250 may be viewed as alternating NULL and DATA "wavefronts". The circuit will not assert an output on either of the Z signal lines 271, 273 until a sufficient number of meaningful data inputs within a DATA wavefront have been presented to each of the input signal line pairs and have propagated through the circuit. The outputs will then remain meaningful until a complete NULL wavefront is received on the inputs and propagated through the circuit. This operation is described more fully below with reference to FIGS. 10–12.

In the beginning state, all input and output signal lines of the circuit have a NULL value. The presence of NULL values on all output signal lines 271, 273, 275, 277 is sufficient to indicate that the circuit is ready to receive data.

As the DATA wavefront arrives at the circuit inputs, individual input signal lines of each input signal line pair are asserted. For example, when input data corresponding to CI=0 is received (and while all other inputs remain NULL), the input signal line 259 is asserted. The outputs of the circuit do not change because all the other inputs remain NULL. Thereafter, when input data corresponding to X=0 is received, the input signal line 263 is asserted. Now the threshold gate 251 asserts its output line C0 because the requisite number of inputs have been asserted. This causes output signal line 275 corresponding to C=0 to switch from NULL to an asserted value. However, there still is no meaningful output Z, because both the double-weighted input to gate 255 from gate 251 and the two inputs to gate 257 from signal lines 259 and 263 are insufficient to switch either gate's output from NULL. Conversely, when an input corresponding to Y=1 is thereafter received, the input signal line 269 is asserted. This causes the threshold gate 255 to assert its output, causing output signal line 273 to be asserted, indicating a meaningful sum output corresponding to Z=1.

It should be apparent at this point that the carry output signal lines 275, 277, may assert a meaningful value independently before meaningful sum output appears on the Z signal lines 271, 273. This is due to the fact that carry may be determined by as few as two meaningful inputs whereas sum requires that all the inputs are meaningful. Furthermore, the data paths that determine sum and carry can be completely independent for a given DATA wavefront. This presents some non-critical timing issues for the NULL convention full adder circuit which is discussed below.

Figure 11:
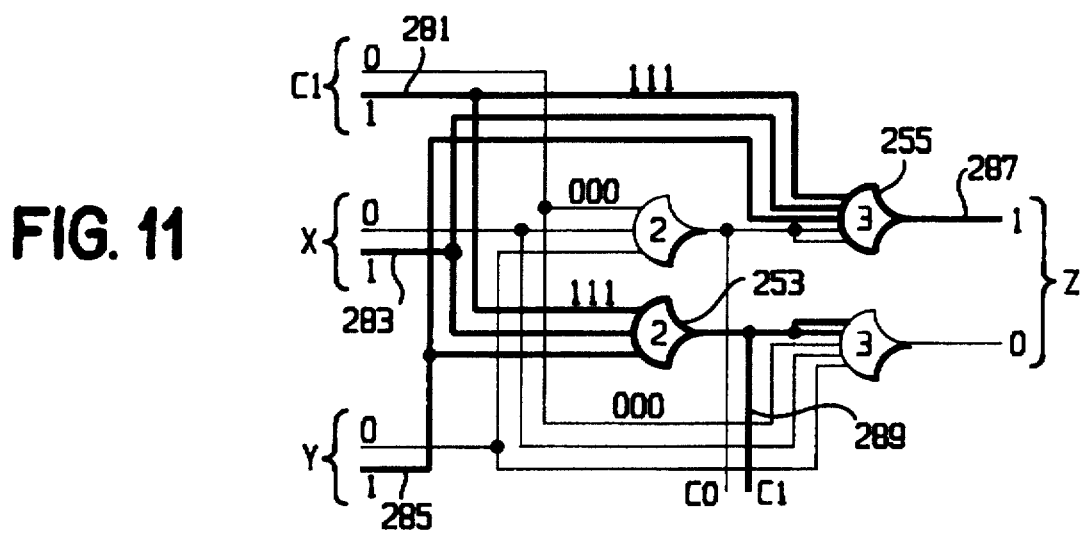
FIG. 11 illustrates timing issues in the NULL convention full adder of FIG. 10 when all three inputs to the adder are present.

FIG. 11 shows a NULL convention full adder circuit in a state with asserted outputs. Asserted lines are indicated in bold. The DATA wavefront has presented meaningful inputs at each of the input signal lines 281, 283, 285, corresponding to CI=1, X=1, Y=1, respectively, causing meaningful outputs to be asserted on the output signal lines 287, 289, corresponding to Z=1 and C=1.

Figure 12:
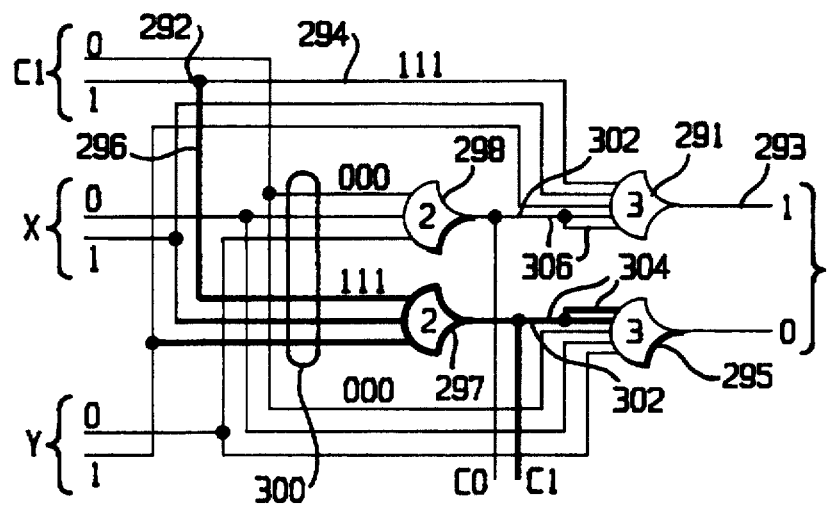
FIG. 12 illustrates non-critical timing delay issues in the NULL convention full adder of FIG. 10 when determining NULL completion.

FIG. 12 shows a NULL convention full adder circuit after the NULL wavefront has arrived and partially propagated NULL inputs through the paths to gate 291, which determine the sum output Z=1. Here, it is assumed that signal line delays are unequal. For example, input signal CI=1 branches at a signal node 292 into first path 294 and second path 296. It will be assumed that the delay to gate 297 is large relative to delay to gate 298. For purpose of illustration, first path 294 is shown as having returned to NULL while second path 296 is shown as still asserted.

Because all inputs to the threshold gate 291 have returned to NULL, that output signal line 293 returns to NULL. However, because NULL has not propagated to the inputs to the threshold gate 297, carry output C=1 may remain asserted for a brief time. If NULL completion is detected by monitoring only the Z return to NULL of Z output signal lines (Z=0 and Z=1), and if detection of NULL completion triggers the presentation of a new data wavefront to the CI, X and Y inputs (as will be discussed with reference to FIG. 19), then a new data wavefront may arrive before NULL has fully propagated through gate 297 and output signal lines C0 and C1. The circuit should be designed so that data paths 300 to the threshold-two gates 298, 297 and the path from threshold-two gates 298, 297 to threshold three gates 293, 295 propagate the NULL wavefront before the next DATA wavefront arrives.

If NULL completion is detected by both sum Z and carry outputs C returning to NULL, then the non-critical delay paths are just portions 306 of the wires from the output of the two-of-three gate 297 to the input of the three-of-four gate 295.

The NULL convention full adder circuit of FIG. 10 may be realized in terms of transistors with the gate implementations disclosed in U.S. patent application Ser. No. 08/318, 510 filed Oct. 10, 1994 entitled "NULL CONVENTION THRESHOLD GATE," which is incorporated here by reference. Two realizations are disclosed here for illustration.

Figure 13:
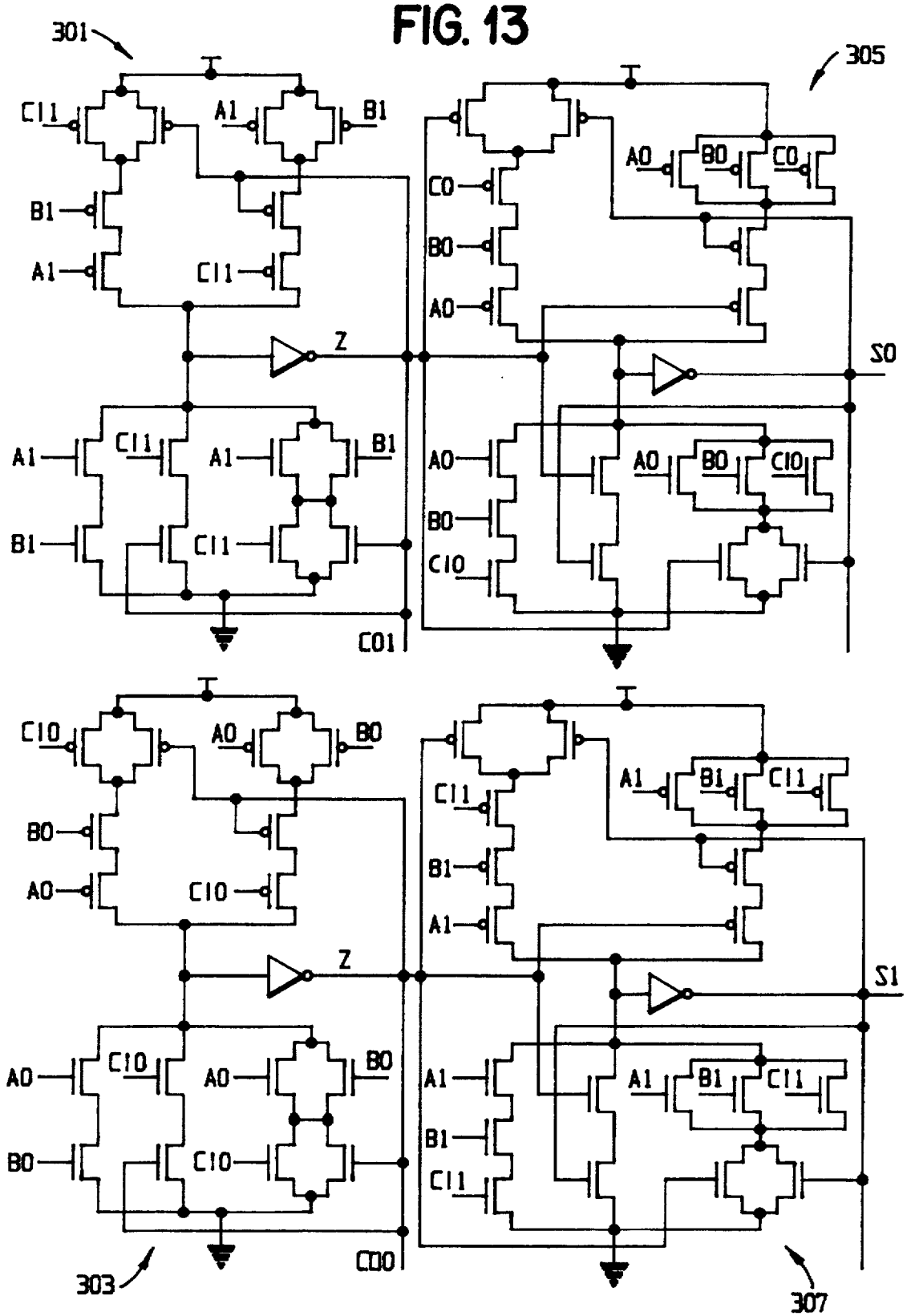
FIG. 13 illustrates a transistor-level circuit diagram of a static CMOS implementation for the NULL convention full adder of FIG. 10.
Figure 14:
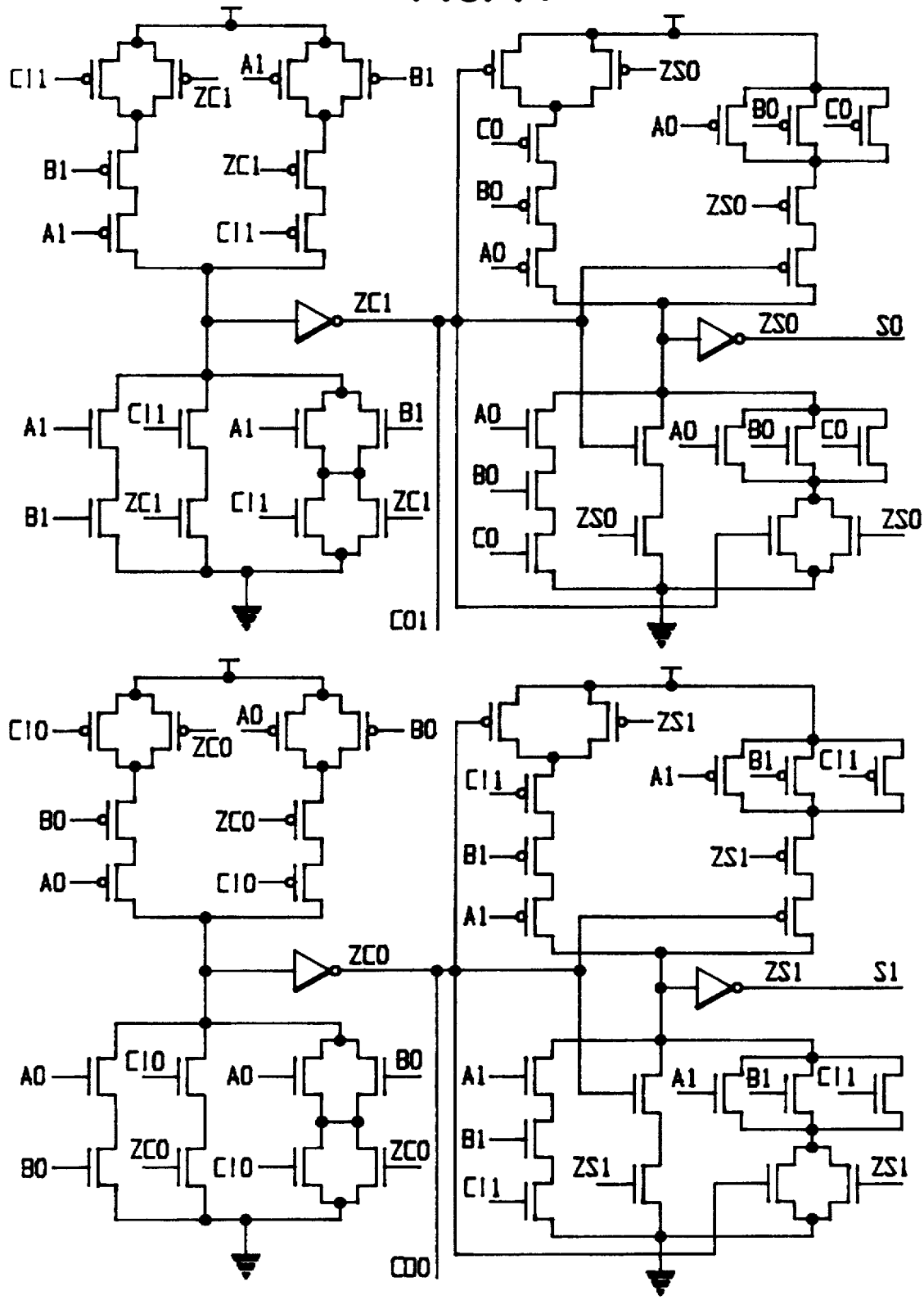
FIG. 14 illustrates a transistor-level circuit diagram of a static CMOS implementation for the NULL convention full adder of FIG. 10 with feedback symbolically connected.

FIGS. 13 and 14 illustrate a transistor-level circuit diagram of a static CMOS implementation for the NULL convention combinational circuit FIG. 10. The inputs in FIGS. 13 and 14 are described as A and B, it being understood that A and B correspond to X and Y in FIG. 10. The outputs in FIGS. 13 and 14 are described as S and CO, it being understood that S and CO correspond to Z and C as in FIG. 10. The letter Z in FIGS. 13 and 14 refers to intermediate gate outputs. Furthermore, FIGS. 13 and 14 use the convention A0, A1, B0, B1, etc. to denote the signal lines for A=0, A=1, B=0, B=1, etc.

The circuit of FIG. 13 includes a first static CMOS two-of-three threshold gate 301, a second static CMOS two-of-three threshold gate 303, a first static CMOS three-of-four threshold gate 305, and a second static CMOS three-of-four threshold gate 307. The input signals A, B, and CI are connected into all of the threshold gates 301, 303, 305, 307. The outputs CO=0, CO=1, S=0, S=1 are connected to the output of threshold gates 303, 301, 305, 307, respectively. The output of threshold gate 301 is further connected to threshold gate 305, and the output of threshold gate 303 is further connected to threshold gate 307. These gates were described in detail with respect to FIGS. 5 and 8.

FIG. 13 shows threshold gate output feedback directly connected back to the PMOS and NMOS transistors of each threshold gate. FIG. 14 shows the circuit of FIG. 13 but with a different drawing convention. In FIG. 14, feedback lines have been deleted, while transistors receiving the feedback signal are shown as receiving a signal given a corresponding signal name, e.g. ZS0, ZS1, ZC1, and ZC0.

Figure 15:
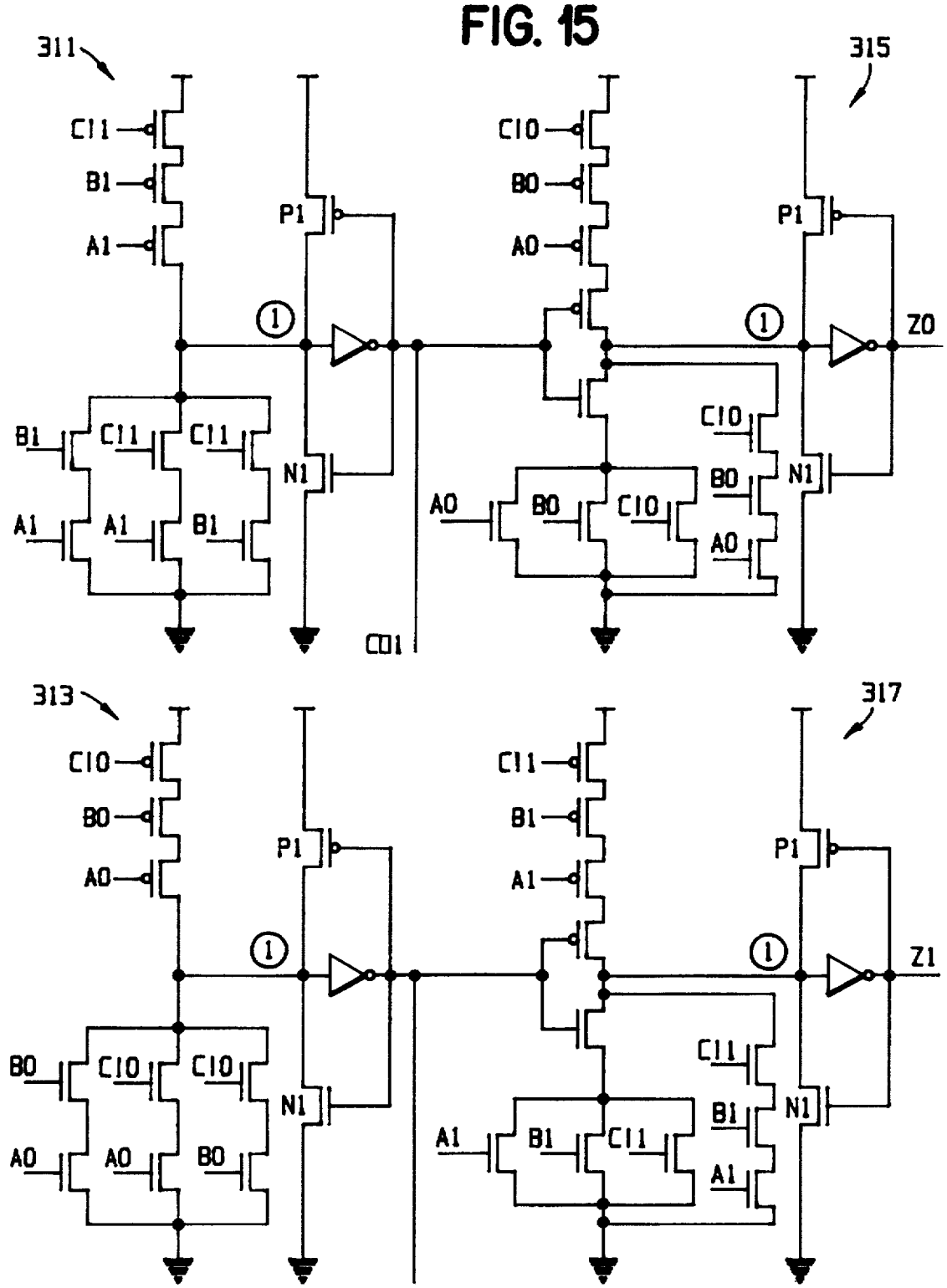
FIG. 15 illustrates a transistor-level circuit diagram of a semi-static CMOS implementation for the NULL convention full adder of FIG. 10.
Figure 16:
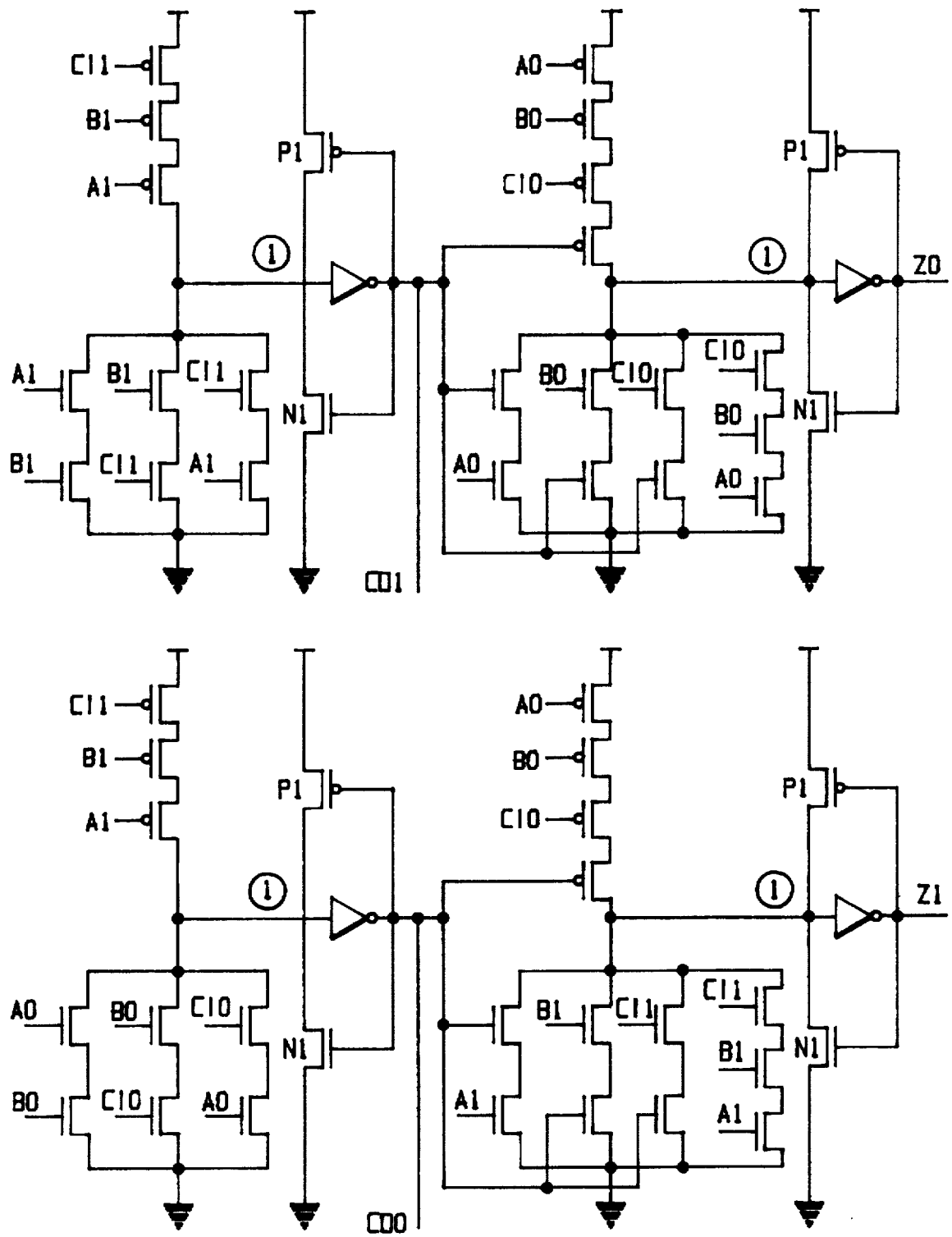
FIG. 16 illustrates a transistor-level circuit diagram of a semi-static CMOS implementation for the NULL convention full adder of FIG. 10 configured with minimal charge sharing.

FIGS. 15 and 16 illustrate a transistor-level circuit diagram of a semi-static CMOS implementation for the NULL convention combinational circuit FIG. 10. The inputs in FIGS. 15 and 16 are described as A and B, it being understood that A and B correspond to X and Y in FIG. 10. The carry outputs in FIGS. 15 and 16 are described as CO, which corresponds to C as in FIG. 10. Furthermore, FIGS. 15 and 16 use the convention A0, A1, B0, B1, etc. to denote the signal lines for A=0, A=1, B=0, B=1, etc.

The circuit of FIG. 15 includes a first semi-static CMOS two-of-three threshold gate 311, a second semi-static CMOS two-of-three threshold gate 313, a first semi-static CMOS three-of-four threshold gate 315, and a second semi-static CMOS three-of-four threshold gate 317. The input signals A, B, and CI are connected into all of the threshold gates 311, 313, 315, 317. The outputs CO=0, CO=1, Z=0, Z=1 are connected to the output of threshold gates 313, 311, 315, 317, respectively. The output of threshold gate 311 is further connected to threshold gate 315, and the output of threshold gate 313 is further connected to threshold gate 317.

Operation of these gates was described in detail with respect to FIGS. 6 and 9. Each of the four threshold gates 311, 313, 315, 317 includes weak "keeper" NMOS transistors N1 and weak "keeper" PMOS transistors P1 with transistor gates connected to the output inverting driver for each threshold gates. The purpose of these "keeper" transistors is to connect the common signal junctions of each threshold gate to the voltage source or ground when the junction would otherwise be isolated.

The implementation of FIG. 16 is similar to the implementation of FIG. 15 except that FIG. 16 shows different configurations of pull-down sub-circuits chosen to minimize charge-sharing between the internal nodes in the pull-down sub-circuits.

The NULL convention half adder circuit of FIG. 10 can be used to make multibit adders in many ways such as ripple carry, carry lookahead, carry select, carry save, and so forth. A ripple carry multibit adder is shown in FIG. 17.

Figure 17:
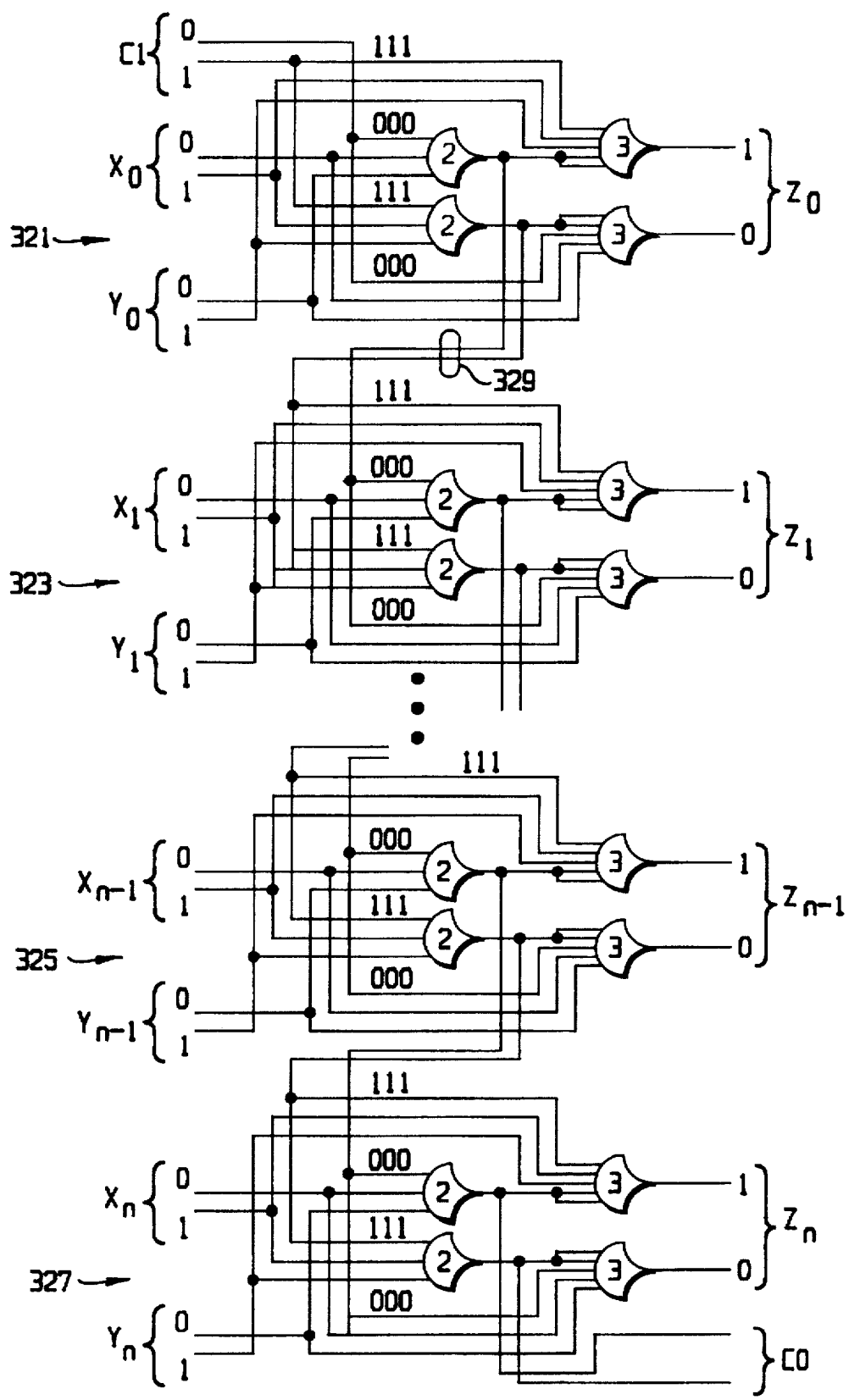
FIG. 17 illustrates a NULL convention combinational circuit implemented as a multibit ripple carry adder.

The multibit adder of FIG. 17 includes NULL convention full adders 0 to n. The drawing shows the two lowest bit adders 321, 323 and the two highest bit adders 325, 327. The adders are combined in progression such that the carry output of the adder for bit 0 is fed into the carry input of the adder for bit 1, the carry output of the adder for bit 1 is fed into the carry input of adder for bit 2, and so on down to the adder for bit n. The adders receive their respective inputs from external sources (not shown) and the outputs are transmitted to external destinations (not shown).

The operation of the multibit ripple carry adder is as follows. When a DATA wavefront consisting of meaningful values for CI, X0 ... Xn, and Y0 ... Yn is presented to the circuit, each of the full adders for bits 0 to n asynchronously processes its individual inputs. However, in order for meaningful output for each adder to be asserted, meaningful input on all of its input signal lines, including carry, must be obtained. Unlike the other adders in the circuit, the adder for bit 0 321 obtains all its input from the DATA wavefront. When it has obtained the threshold number of inputs, it asserts its carry output 329. The second adder 323 (for bit 1) cannot produce meaningful output on its sum Z1 output line until this carry 329 ripples down from the first adder 321. Furthermore, the second adder may not always produce a meaningful carry output until a meaningful carry input is received from bit 0 adder 321. This effect ripples through the circuit, such that full-adder 327 may not produce meaningful sum output until carry has rippled through each of the lower bit adders 0 through (n−1).

Under certain circumstances, a carry output for an adder stage may become meaningful before the sum output. With reference to Table 1, when both data inputs X,Y are zero, the full-adder's carry output will certainly be zero regardless of the carry input. Thus, if the two input X,Y have transitioned from NULL to zero, the carry output line CO can be asserted, even if the carry input remains NULL. In the context of a multi-bit adder, with the carry output of one stage cascaded to the carry input of a subsequent stage, some carry output lines may be asserted totally independently from other carry output lines. It is not sufficient to monitor the carry output of the last stage to determine when the full adder circuit has completely processed a data (or NULL) wavefront.

Output detection can be facilitated through the addition of an asynchronous register to the NULL convention full adder circuit of FIG. 10. Further information regarding asynchronous registration in NULL convention logic circuits can be found in U.S. application Ser. No. 08/318,508, filed Oct. 5, 1994 entitled "ASYNCHRONOUS REGISTER FOR NULL CONVENTION LOGIC SYSTEMS," which is incorporated herein by reference. An asynchronous register serves to store a group of NULL convention signals and, with a "watcher" gate discussed more fully below, to indicate when a complete DATA or NULL wavefront has been stored.

Figure 18:
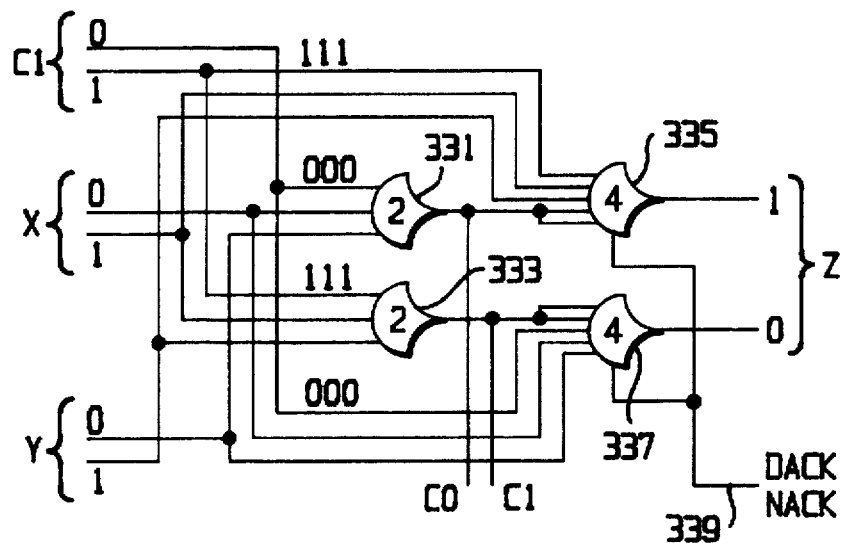
FIG. 18 illustrates a four-gate implementation of a NULL convention full adder with embedded asynchronous register.

FIG. 18 illustrates a NULL convention full adder with embedded asynchronous register. The circuit of FIG. 18 includes a first two-of-three threshold gate 331, a second two-of-three threshold gate 333, a first four-of-five threshold gate 335, and a second four-of-five threshold gate 337. The input and output signals are the same as the circuit of FIG. 10 except for the addition of a signal 339 labeled "DACK/NACK". This signal is input to the first and second four-of-five threshold gates 335, 337 from a downstream source (not shown).

The purpose of the DACK/NACK signal 339 is to control the flow of NULL and DATA wavefronts output from the full adder circuit of FIG. 18. When this signal is asserted, it indicates the downstream circuit is ready to receive meaningful data. Furthermore, meaningful data cannot be asserted on the outputs of threshold gates 335, 337 unless and until the DACK/NACK signal 339 is asserted. Likewise, the outputs of threshold gates 335, 337 cannot switch to NULL unless and until the DACK/NACK signal 339 switches to NULL.

The use of the term "downstream" is consistent with the "wavefront" concept used to describe the asynchronous operation of NULL convention combinational circuits. A "downstream" source is one that receives the NULL and DATA wavefronts after propagation through the current circuit is achieved. Conversely, an "upstream" source propagates the wavefronts before the current circuit.

To illustrate, assume a NULL wavefront has fully propagated through the circuit of FIG. 18 and that the DACK/NACK signal 339 is NULL. When a DATA wavefront arrives at the input consisting of CI=1, X=1, and Y=1, for example, three inputs to the first four-of-five threshold gate 335 are asserted. The output of the first two-of-three threshold gate 331 is NULL because none of its inputs is asserted. Thus, the input to the threshold gate 335 from gate 331 is NULL. These three asserted inputs are insufficient to switch the output Z=1 to an asserted level because the DACK/NACK signal 339 is NULL. When the downstream source controlling the DACK/NACK signal is ready to receive data, it indicates so by asserting the DACK/NACK signal. Threshold-four gate 335 now has an additional asserted input which allows threshold gate 335 to assert its output corresponding to Z=1. After the DACK/NACK signal has been asserted, if a NULL wavefront is input to the full adder circuit, the output of threshold gate 335 remains asserted until the downstream source indicates that it is ready to clear the output by switching the DACK/NACK signal to NULL.

Casual comparison of the adder of FIG. 18 with the adder of FIG. 10 reveals the benefit of designs using NULL convention threshold logic. The function of asynchronous registration has been integrated into the adder of FIG. 10 with the increase by one of the thresholds of two gates.

The NULL convention full adder circuit of FIG. 18 can be combined in a manner similar to the circuit of FIG. 10 to make multibit adders in many ways such as ripple carry, carry lookahead, carry select, carry save, and so forth. A ripple carry multibit adder with embedded registration and end of ripple completion detection is shown in FIG. 19.

Figure 19:
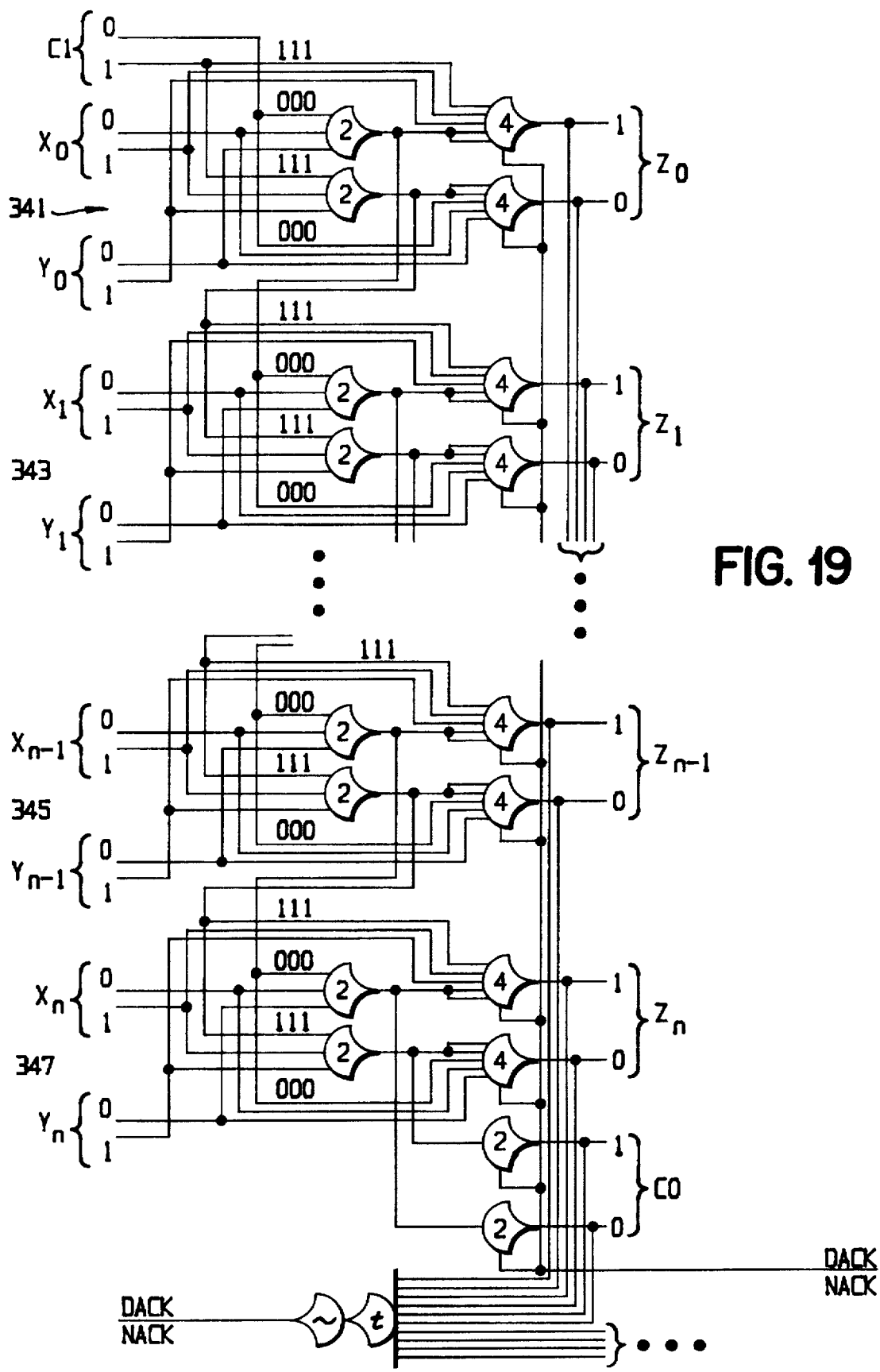
FIG. 19 illustrates a NULL convention combinational circuit implemented as a multibit ripple carry adder with embedded asynchronous registration and end of ripple completion detection.

The multibit adder of FIG. 19 includes NULL convention full adders "0" to "n." The drawing shows the two lowest bit adders 341, 343 and the two highest bit adders 345, 347. The adders are combined in progression such that the carry output of the adder for the first bit (bit 0) is fed into the carry input of the adder for the second bit (bit 1), the carry output of the adder for the second bit is fed into the carry input of adder for the third bit (bit 2), and so on down to the adder for the last bit (bit n). The adders receive their inputs from external sources (not shown) and transmit their outputs to external destinations (not shown).

The multibit adder circuit of FIG. 19 further includes a first DACK/NACK signal input 349 from a downstream source (not shown), a DACK/NACK monitor consisting of a threshold-t gate 351 and a NULL convention inverting driver 353, and a second DACK/NACK feedback output 355, which connects to an upstream circuit (not shown). The threshold value "t" equals the number of stages (n+1) plus one (for the carry output of the highest order stage). A pair of two-of-two NULL convention threshold gates 365, 367 are included in the highest-order stage (bit n) to provide asynchronous registration of the carry output of the multibit adder of FIG. 19.

The purpose of the DACK/NACK signal 349 is to control the DATA and NULL wavefront input to the downstream source from the multibit adder of FIG. 19. The signal 349 is fed into each of the four-of-five threshold gates for each of the bit adders to provide asynchronous registration of the outputs. The signal 349 is further fed into threshold gates 365, 367 to control the carry output to the downstream source from the multibit adder of FIG. 19.

The purpose of the DACK/NACK monitor 351,353 and the DACK/NACK feedback 355 is to control DATA and NULL wavefronts input into the circuit of FIG. 19 from an upstream source. The DACK/NACK monitor 351,353 receives inputs from the sum outputs from each of the adders 341, 343, ... 345, 347 as well as the carry output from the two-of-two threshold gates of the highest order bit adder 365, 367. The DACK/NACK monitor consists of a threshold-t gate 351 and an inverting driver 353.

The operation of the multibit ripple carry adder of FIG. 19 is as follows. When a DATA wavefront consisting of meaningful values for CI, X0 ... Xn, and Y0 ... Yn is presented to the circuit, each of the full adders (for bits 0 to n) asynchronously processes its individual inputs. In order for meaningful output for each adder to be asserted, meaningful input on all of its input signal lines must be obtained, including carry from a lower stage. Unlike the other adders in the circuit, the first adder 341 (for bit 0) obtains all its input from the DATA wavefront. When it has obtained the threshold number of inputs, the adder asserts its carry output. The second adder 343 (for the bit 1) cannot produce a meaningful output on its sum Z output line until this carry ripples down from adder 341. (Adder 343 may, under certain circumstances, produce a carry output, even though a meaningful carry input is not received from adder 341, as when, for example, both inputs X1,Y1 equal one.)

The DACK/NACK signal 349 controls output to the downstream circuit as follows. After the DATA wavefront has fully arrived and propagated through the circuit, meaningful output is ready to be asserted on each of the adders (0 through n). However, meaningful output cannot be asserted until the DACK/NACK signal 349 is asserted by the downstream circuit. It does so when it is ready to receive input from the multibit adder of FIG. 19. After the NULL wavefront has arrived and fully propagated through the circuit, the outputs are ready to return to NULL. However, NULL cannot be output until the DACK/NACK signal 349 returns to NULL. It does so when the downstream circuit indicates that it is ready for the next DATA wavefront by driving DACK/NACK signal 349 to NULL.

The DACK/NACK monitor and the DACK/NACK feedback output 355 controls input into the multibit adder of FIG. 19 from an upstream circuit as follows. After a NULL wavefront has fully arrived and propagated through the circuit, and the DACK/NACK signal 349 is driven NULL by the downstream source, NULL appears on the outputs of each adder (0 through n), as well as the carry output from the highest-order adder (for bit n). The outputs from the adders as well as the carry output from highest order adder (for bit n) are input into the threshold-t gate 351. This drives its output NULL, which is inverted by driver 353 such that the DACK/NACK feedback output line 355 is asserted. This indicates to the upstream source that the multibit adder of FIG. 19 is ready to receive input data. After the DATA wavefront has arrived from the upstream source and has fully propagated through the circuit, meaningful data is ready at the output of each bit adder (0 through n). The downstream source indicates it is ready to receive the data by asserting DACK/NACK signal 349. This causes meaningful output to appear on one line on each of the adders as well as on one line of the carry output for the highest-order adder (bit n). The threshold gate 351 asserts its output, which is inverted by driver 353, causing DACK/NACK feedback line 355 to go to NULL, indicating to the upstream circuit that the multibit adder of FIG. 19 is ready to receive the next NULL wavefront. The threshold value "t" is determined by the number of adders. Each adder asserts one line when data is fully propagated (either "0" or "1" for each adder). The DACK/NACK monitor 351,353 monitors all "Z" signal lines, and the carry output CO from the highest order adder 347. The threshold required to ensure that all stages have meaning outputs is thus n+2, (n+1 for the number of adders 0 to n, and one for the last carry).

After learning of the embodiments disclosed herein, people practicing in this art will be able to make variations that fall within the spirit and scope of the invention. The disclosed embodiments are exemplary but not intended to limit unduly the scope of the invention as defined by the following claims.

What is claimed is:

1. A NULL convention half adder comprising:
   a first input receiving a first input signal, said first input signal having first and second meaningful states corresponding to first and second binary values, said first input signal further having a NULL state;
   a second input receiving a second input signal, said second input signal having first and second meaningful states corresponding to first and second binary values, said second input further having a NULL state;
   a first output transmitting a first output signal, said first output signal having first and second meaningful states, said first output signal further having a NULL state; and
   a plurality of interconnected NULL convention threshold gates receiving said first and second input signals and generating said first output signal, said gates generating a meaningful output state on said first output in accordance with a sum of said first and second input signals when said first and second input signals are meaningful, said gates holding said output signal in a meaningful state until both first and second input signals are in NULL states.

2. The adder of claim 1 further comprising a third input receiving a third input signal, the third input signal having an asserted state and a NULL state;
   wherein said gates generating the sum output signal hold the sum output in a meaningful state until said third input is in the NULL state;
   thereby storing said first output signal.

3. A NULL convention full adder for adding NULL convention signals having a NULL state and first and second meaningful states corresponding to first and second binary values, the adder comprising:

19 first, second and third inputs receiving first, second and third NULL convention input signals respectively;

first and second outputs transmitting first and second NULL convention output signals respectively; and a plurality of interconnected NULL convention threshold gates receiving the input signals and generating a first meaningful output in accordance with a sum of the input signals when the input signals are meaningful, said gates holding the first meaningful output until the first, second and third input signals are NULL, said gates further generating a second meaningful output in accordance with a carry of the input signals when the input signals are meaningful, said gates holding said second meaningful output until the first, second and third input signals are NULL.

4. The adder of claim 3 further comprising a fourth input receiving a fourth input signal, the fourth input signal having an asserted state and a NULL state;

wherein said gates generating the sum output hold the sum output in a meaningful state until said fourth input is in the NULL state;

thereby storing said first output signal.

5. A NULL convention multi-bit adder comprising a plurality of NULL convention adders, each adder including NULL convention threshold gates, each adder receiving first and second NULL convention inputs, ones of said adders further receiving a carry signal from other ones of said adders, each adder generating a meaningful sum output in accordance with a sum of inputs, each adder holding the meaningful output until all inputs are NULL.

6. The multi-bit adder of claim 5 wherein each adder further receives a third input having an asserted and a NULL state, and each said adder holds a meaningful sum output until all inputs are NULL.

7. The multi-bit adder of claim 5 further including a watcher circuit detecting the presence of all meaningful sum outputs.

8. The multi-bit adder of claim 5 further including a watcher circuit detecting the presence of all NULL sum outputs.

9. A NULL convention adder comprising:

a first NULL convention threshold gate receiving first, second and third inputs and generating a first NULL convention output signal;

a second NULL convention threshold gate receiving the first, second and third inputs and generating a second NULL convention output signal;

a third NULL convention threshold gate receiving the first, second and third inputs, and generating a third NULL convention output signal;

a fourth NULL convention threshold gate receiving the first, second and third inputs and generating a fourth NULL convention output signal;

said first and second gates generating a meaningful carry output in accordance with a carry of first and second inputs;

said second and third gates generating a meaningful sum output in accordance with a sum of first and second inputs.

10. The adder of claim 9 wherein a NULL convention threshold gate comprises a three-input, threshold two gate.

11. The adder of claim 10 wherein a three-input threshold two gate comprises:

a driver generating first and second output states in response to first and second states at the driver input;

20 a pull-up circuit pulling the driver input to the first state in response to three of said first, second and third inputs and the driver output; and a pull-down circuit pulling the driver to the second state in response to two of said first, second and third inputs and the driver output.

12. The adder of claim 10 wherein a three-input threshold two gate comprises:

a driver generating first and second output states in response to first and second states at the driver input;

a first transistor pulling the driver input to the first state (high) in response to the first output state (low);

a second transistor pulling the driver input to the second state (low) in response to the second output state (high);

a pull-up circuit pulling the driver input to the first state in response to the first, second and third inputs and the driver output; and a pull-down circuit pulling the driver to the second state in response to two of said first, second and third inputs.

13. The adder of claim 9 wherein a NULL convention threshold gate comprises a four-input, threshold three gate.

14. The adder of claim 13 wherein a four-input threshold three gate comprises:

a driver generating first and second output states in response to first and second states at the driver input;

a first transistor pulling the driver input to the first state (high) in response to the first output state (low);

a second transistor pulling the driver input to the second state (low) in response to the second output state (high);

a pull-up circuit pulling the driver input to the first state in response to the first, second, third and fourth inputs and the driver output.

15. The adder of claim 14 further comprising a pull-down circuit pulling the driver input to the second state in response to said first, second and third inputs.

16. The adder of claim 14 further comprising a pull-down circuit pulling the driver to the second state in response to said fourth input and one of said first, second and third inputs.

17. The adder of claim 14 further comprising:

a first pull-down circuit pulling the driver input to the second state in response to said first, second and third inputs; and a second pull-down circuit pulling the driver input to the second state in response to said fourth input and one of said first, second and third inputs.

18. The adder of claim 13 wherein a four-input threshold three gate comprises:

a driver generating first and second output states in response to first and second states at the driver input; and a pull-up circuit pulling the driver input to the first state in response to four of said first, second, third and fourth inputs and the driver output.

19. The adder of claim 13 wherein a four-input threshold three gate comprises:

a driver generating first and second output states in response to first and second states at the driver input; and a pull-up circuit pulling the driver input to the first state in response to said fourth output, said driver output, and one of said first, second, and third inputs.

20. The adder of claim 13 wherein a four-input threshold three gate comprises:

a driver generating first and second output states in response to first and second states at the driver input; and a pull-down circuit pulling the driver to the second state in response to three of said first, second and third inputs.

21. The adder of claim 13 wherein a four-input threshold three gate comprises:

a driver generating first and second output states in response to first and second states at the driver input; and a pull-down circuit pulling the driver to the second state in response to a combination of one of said first, second and third inputs, and one of said fourth input and driver output.

22. The adder of claim 13 wherein a four-input threshold three gate comprises:

a driver generating first and second output states in response to first and second states at the driver input; and a pull-down circuit pulling the driver to the second state in response to said fourth input and said driver output.

23. The adder of claim 13 wherein a four-input threshold three gate comprises:

a driver generating first and second output states in response to first and second states at the driver input;

a first pull-up circuit pulling the driver input to the first state in response to four of said first, second, third and fourth inputs and the driver output;

a second pull-up circuit pulling the driver input to the first state in response to said fourth output, said driver output, and one of said first, second, and third inputs;

a first pull-down circuit pulling the driver to the second state in response to three of said first, second and third inputs;

a second pull-down circuit pulling the driver to the second state in response to a combination of one of said first, second and third inputs, and one of said fourth input and driver output; and a third pull-down circuit pulling the driver to the second state in response to said fourth input and said driver output.

24. The adder of claim 9 wherein a NULL convention threshold gate comprises a five-input, threshold four gate.

* * * * *